US011923341B2

(12) United States Patent
Quader et al.

(10) Patent No.: US 11,923,341 B2
(45) Date of Patent: Mar. 5, 2024

(54) MEMORY DEVICE INCLUDING MODULAR MEMORY UNITS AND MODULAR CIRCUIT UNITS FOR CONCURRENT MEMORY OPERATIONS

(71) Applicant: Sunrise Memory Corporation, San Jose, CA (US)

(72) Inventors: Khandker Nazrul Quader, Santa Clara, CA (US); Robert Norman, Pendleton, OR (US); Frank Sai-keung Lee, San Jose, CA (US); Christopher J. Petti, Mountain View, CA (US); Scott Brad Herner, Portland, OR (US); Siu Lung Chan, San Jose, CA (US); Sayeef Salahuddin, Walnut Creek, CA (US); Mehrdad Mofidi, Los Altos Hills, CA (US); Eli Harari, Saratoga, CA (US)

(73) Assignee: SUNRISE MEMORY CORPORATION, San Jose, CA (US)

(*) Notice: Subject to any disclaimer, the term of this patent is extended or adjusted under 35 U.S.C. 154(b) by 177 days.

(21) Appl. No.: 17/467,011

(22) Filed: Sep. 3, 2021

(65) Prior Publication Data
US 2021/0398949 A1 Dec. 23, 2021

Related U.S. Application Data

(63) Continuation of application No. 16/776,279, filed on Jan. 29, 2020, now Pat. No. 11,670,620.
(Continued)

(51) Int. Cl.
H01L 25/065 (2023.01)
G06F 3/06 (2006.01)
(Continued)

(52) U.S. Cl.
CPC ........ *H01L 25/0657* (2013.01); *G06F 3/0604* (2013.01); *G06F 3/0655* (2013.01);
(Continued)

(58) Field of Classification Search
CPC ....... H01L 25/0657; H01L 2224/08145; H01L 24/08; H01L 2224/16145; G06F 3/0679
See application file for complete search history.

(56) References Cited

U.S. PATENT DOCUMENTS 4,213,139 A 7/1980 Rao
5,583,808 A 12/1996 Brahmbhatt
(Continued)

FOREIGN PATENT DOCUMENTS

CN 107658317 A * 2/2018 ........... H01L 23/481
CN 107658317 A 2/2018
(Continued)

OTHER PUBLICATIONS

"EP Extended Search Report EP168690149.3", dated Oct. 18, 2019.
(Continued)

Primary Examiner — Mamadou L Diallo
(74) Attorney, Agent, or Firm — Edward C. Kwok; VLP Law Group LLP

(57) ABSTRACT

An electronic device with embedded access to a high-bandwidth, high-capacity fast-access memory includes (a) a memory circuit fabricated on a first semiconductor die, wherein the memory circuit includes numerous modular memory units, each modular memory unit having (i) a three-dimensional array of storage transistors, and (ii) a group of conductors exposed to a surface of the first semiconductor die, the group of conductors being configured for communicating control, address and data signals associated the memory unit; and (b) a logic circuit fabricated on a second semiconductor die, wherein the logic circuit also
(Continued)

includes conductors each exposed at a surface of the second semiconductor die, wherein the first and second semiconductor dies are wafer-bonded, such that the conductors exposed at the surface of the first semiconductor die are each electrically connected to a corresponding one of the conductors exposed to the surface of the second semiconductor die. The three-dimensional array of storage transistors may be formed by NOR memory strings.

20 Claims, 25 Drawing Sheets

Related U.S. Application Data

(60) Provisional application No. 62/843,733, filed on May 6, 2019, provisional application No. 62/803,689, filed on Feb. 11, 2019, provisional application No. 62/798,673, filed on Jan. 30, 2019.

(51) Int. Cl.
  *G06F 11/10* (2006.01)
  *G06F 12/0802* (2016.01)
  *G06N 3/02* (2006.01)
  *H01L 25/00* (2006.01)
  *G11C 16/04* (2006.01)

(52) U.S. Cl.
  CPC ........ *G06F 3/0679* (2013.01); *G06F 11/1068* (2013.01); *G06F 12/0802* (2013.01); *G06N 3/02* (2013.01); *H01L 25/50* (2013.01); *G06F 2212/60* (2013.01); *G06F 2212/72* (2013.01); *G11C 16/0483* (2013.01); *H01L 2225/06513* (2013.01); *H01L 2225/06541* (2013.01)

(56) References Cited

U.S. PATENT DOCUMENTS

| | | | |
|---|---|---|---|
| 5,646,886 A | 7/1997 | Brahmbhatt | |
| 5,656,842 A | 8/1997 | Wamatsu | |
| 5,768,192 A | 6/1998 | Eitan | |
| 5,789,776 A | 8/1998 | Lancaster et al. | |
| 5,915,167 A | 6/1999 | Leedy | |
| 6,040,605 A | 3/2000 | Sano et al. | |
| 6,107,133 A | 8/2000 | Furukawa et al. | |
| 6,118,171 A | 9/2000 | Davies et al. | |
| 6,130,838 A | 10/2000 | Kim et al. | |
| 6,434,053 B1 | 8/2002 | Fujiwara | |
| 6,580,124 B1 | 6/2003 | Cleeves et al. | |
| 6,744,094 B2 | 6/2004 | Forbes | |
| 6,774,458 B2 | 8/2004 | Fricke et al. | |
| 6,873,004 B1 | 3/2005 | Han et al. | |
| 6,881,994 B2 | 4/2005 | Lee et al. | |
| 6,946,703 B2 | 9/2005 | Ryu et al. | |
| 7,005,350 B2 | 2/2006 | Walker et al. | |
| 7,221,613 B2 | 5/2007 | Pelley et al. | |
| 7,284,226 B1 | 10/2007 | Kondapalli | |
| 7,307,308 B2 | 12/2007 | Lee | |
| 7,475,174 B2 | 1/2009 | Chow | |
| 7,489,002 B2 | 2/2009 | Forbes et al. | |
| 7,524,725 B2 | 4/2009 | Chung | |
| 7,612,411 B2 | 11/2009 | Walker | |
| 8,026,521 B1 | 9/2011 | Or-Bach et al. | |
| 8,139,418 B2 | 3/2012 | Carman | |
| 8,178,396 B2 | 5/2012 | Sinha et al. | |
| 8,244,993 B2 | 8/2012 | Grundy et al. | |
| 8,630,114 B2 | 1/2014 | Lue | |
| 8,653,672 B2 | 2/2014 | Leedy | |
| 8,767,473 B2 | 7/2014 | Shim et al. | |
| 8,848,425 B2 | 9/2014 | Schloss | |
| 8,878,278 B2 | 11/2014 | Alsmeier et al. | |
| 9,190,293 B2 | 11/2015 | Wang et al. | |
| 9,202,694 B2 | 12/2015 | Konevecki et al. | |
| 9,230,985 B1 | 1/2016 | Wu et al. | |
| 9,412,752 B1 | 8/2016 | Yeh et al. | |
| 9,455,268 B2 | 9/2016 | Oh et al. | |
| 9,620,605 B2 | 4/2017 | Liang et al. | |
| 9,633,944 B2 | 4/2017 | Kim | |
| 9,748,172 B2 | 8/2017 | Takaki | |
| 9,799,761 B2 | 10/2017 | Or-Bach et al. | |
| 9,842,651 B2 | 12/2017 | Harari | |
| 9,892,800 B2 | 2/2018 | Harari | |
| 9,911,497 B1 | 3/2018 | Harari | |
| 10,074,667 B1 | 9/2018 | Higashi | |
| 10,096,364 B2 | 10/2018 | Harari | |
| 10,102,884 B2 | 10/2018 | Coteus et al. | |
| 10,121,553 B2 | 11/2018 | Harari | |
| 10,249,370 B2 | 4/2019 | Harari | |
| 10,254,968 B1 | 4/2019 | Gazit et al. | |
| 10,283,452 B2* | 5/2019 | Zhu | H10B 43/40 |
| 10,283,493 B1* | 5/2019 | Nishida | H10B 43/27 |
| 10,297,578 B2 | 5/2019 | Tagami et al. | |
| 10,319,696 B1 | 6/2019 | Nakano | |
| 10,373,956 B2 | 8/2019 | Gupta et al. | |
| 10,381,370 B2* | 8/2019 | Shin | H10B 41/27 |
| 10,381,378 B1 | 8/2019 | Harari | |
| 10,395,737 B2 | 8/2019 | Harari | |
| 10,431,596 B2 | 10/2019 | Herner et al. | |
| 10,475,812 B2 | 11/2019 | Harari | |
| 10,622,377 B2 | 4/2020 | Harari et al. | |
| 10,651,153 B2 | 5/2020 | Fastow et al. | |
| 10,692,837 B1 | 6/2020 | Nguyen et al. | |
| 10,692,874 B2 | 6/2020 | Harari et al. | |
| 10,804,202 B2* | 10/2020 | Nishida | H01L 21/76251 |
| 11,500,803 B2 | 11/2022 | Ngo et al. | |
| 11,580,038 B2 | 2/2023 | Norman et al. | |
| 2001/0030340 A1 | 10/2001 | Fujiwara | |
| 2001/0053092 A1 | 12/2001 | Kosaka et al. | |
| 2002/0028541 A1 | 3/2002 | Lee et al. | |
| 2002/0051378 A1 | 5/2002 | Ohsawa | |
| 2002/0193484 A1 | 12/2002 | Albee | |
| 2004/0214387 A1 | 10/2004 | Madurawe et al. | |
| 2004/0246807 A1 | 12/2004 | Lee | |
| 2004/0262681 A1 | 12/2004 | Masuoka et al. | |
| 2004/0262772 A1 | 12/2004 | Ramanathan et al. | |
| 2005/0002267 A1 | 1/2005 | Daughton et al. | |
| 2005/0128815 A1 | 6/2005 | Ishikawa et al. | |
| 2005/0280061 A1 | 12/2005 | Lee | |
| 2006/0155921 A1 | 7/2006 | Gorobets et al. | |
| 2008/0091888 A1 | 4/2008 | Sandy | |
| 2008/0239812 A1 | 10/2008 | Naofumi et al. | |
| 2009/0057722 A1 | 3/2009 | Masuoka et al. | |
| 2009/0157946 A1 | 6/2009 | Arya | |
| 2009/0237996 A1 | 9/2009 | Kirsch et al. | |
| 2009/0279360 A1 | 11/2009 | Peter et al. | |
| 2009/0290442 A1 | 11/2009 | Rajan | |
| 2009/0302303 A1 | 12/2009 | Lowrey | |
| 2009/0316487 A1 | 12/2009 | Lee et al. | |
| 2010/0036960 A1* | 2/2010 | Kowalewski | H04L 67/1095 709/228 |
| 2010/0121994 A1 | 5/2010 | Kim et al. | |
| 2010/0124116 A1 | 5/2010 | Takashi et al. | |
| 2010/0213458 A1 | 8/2010 | Prall | |
| 2010/0219392 A1 | 9/2010 | Awaya et al. | |
| 2010/0254191 A1 | 10/2010 | Son et al. | |
| 2011/0115011 A1 | 5/2011 | Masuoka et al. | |
| 2011/0134705 A1 | 6/2011 | Jones et al. | |
| 2011/0170266 A1 | 7/2011 | Haensh et al. | |
| 2011/0208905 A1 | 8/2011 | Shaeffer et al. | |
| 2011/0298013 A1 | 12/2011 | Hwang et al. | |
| 2011/0310683 A1 | 12/2011 | Gorobets | |
| 2012/0032250 A1 | 2/2012 | Son et al. | |
| 2012/0182801 A1 | 7/2012 | Lue | |
| 2012/0243314 A1 | 9/2012 | Takashi | |
| 2012/0307568 A1 | 12/2012 | Banna et al. | |
| 2013/0007349 A1 | 1/2013 | D'Abreu et al. | |
| 2013/0256780 A1 | 10/2013 | Kai et al. | |
| 2014/0015036 A1 | 1/2014 | Fursin et al. | |
| 2014/0040698 A1 | 2/2014 | Loh et al. | |
| 2014/0075135 A1 | 3/2014 | Choi et al. | |
| 2014/0117366 A1 | 5/2014 | Saitoh | |

(56) References Cited

U.S. PATENT DOCUMENTS

| | | |
|---|---|---|
| 2014/0151774 A1 | 6/2014 | Rhie |
| 2014/0247674 A1 | 9/2014 | Karda et al. |
| 2014/0328128 A1 | 11/2014 | Louie et al. |
| 2014/0340952 A1 | 11/2014 | Ramaswamy et al. |
| 2015/0155876 A1 | 6/2015 | Jayasena et al. |
| 2015/0194440 A1 | 7/2015 | Noh et al. |
| 2015/0249143 A1 | 9/2015 | Sano |
| 2015/0263005 A1 | 9/2015 | Zhao et al. |
| 2015/0347331 A1* | 12/2015 | Park .................. G06F 13/1689 710/308 |
| 2015/0372099 A1 | 12/2015 | Chen et al. |
| 2016/0013156 A1 | 1/2016 | Zhai et al. |
| 2016/0019951 A1 | 1/2016 | Park et al. |
| 2016/0035711 A1 | 2/2016 | Hu |
| 2016/0079164 A1* | 3/2016 | Fukuzumi ............ H01L 21/185 438/107 |
| 2016/0086970 A1 | 3/2016 | Peng |
| 2016/0225860 A1 | 8/2016 | Karda et al. |
| 2016/0314042 A1 | 10/2016 | Plants |
| 2017/0092370 A1 | 3/2017 | Harari |
| 2017/0092371 A1 | 3/2017 | Harari |
| 2017/0148517 A1* | 5/2017 | Harari ................ H01L 29/4234 |
| 2017/0148810 A1 | 5/2017 | Kai et al. |
| 2017/0213821 A1 | 7/2017 | Or-Bach et al. |
| 2017/0358594 A1 | 12/2017 | Lu et al. |
| 2018/0095127 A1 | 4/2018 | Pappu et al. |
| 2018/0108416 A1 | 4/2018 | Harari |
| 2018/0211696 A1 | 7/2018 | Kim et al. |
| 2018/0261575 A1* | 9/2018 | Tagami ................ H01L 24/08 |
| 2018/0269229 A1 | 9/2018 | Or-Bach et al. |
| 2018/0331042 A1 | 11/2018 | Manusharow et al. |
| 2018/0357165 A1 | 12/2018 | Helmick et al. |
| 2018/0366471 A1 | 12/2018 | Harari et al. |
| 2018/0366485 A1 | 12/2018 | Harari |
| 2018/0366489 A1 | 12/2018 | Harari et al. |
| 2019/0006009 A1 | 1/2019 | Harari |
| 2019/0019564 A1 | 1/2019 | Li et al. |
| 2019/0042137 A1* | 2/2019 | Wysocki .............. G06F 3/0604 |
| 2019/0043836 A1* | 2/2019 | Fastow .................. H10B 41/27 |
| 2019/0067327 A1 | 2/2019 | Herner et al. |
| 2019/0130946 A1 | 5/2019 | Sim et al. |
| 2019/0157296 A1 | 5/2019 | Harari et al. |
| 2019/0171391 A1* | 6/2019 | Dubeyko ............. G06F 3/0659 |
| 2019/0180821 A1 | 6/2019 | Harari |
| 2019/0206890 A1 | 7/2019 | Harari et al. |
| 2019/0214077 A1 | 7/2019 | Oh et al. |
| 2019/0238134 A1 | 8/2019 | Lee et al. |
| 2019/0244971 A1 | 8/2019 | Harari |
| 2019/0259769 A1 | 8/2019 | Karda et al. |
| 2019/0303042 A1 | 10/2019 | Kim et al. |
| 2019/0325945 A1 | 10/2019 | Linus |
| 2019/0325964 A1 | 10/2019 | Harari |
| 2019/0332321 A1* | 10/2019 | Chen .................. G06F 13/1668 |
| 2019/0319044 A1 | 11/2019 | Harari |
| 2019/0348424 A1 | 11/2019 | Karda et al. |
| 2019/0355747 A1 | 11/2019 | Herner et al. |
| 2019/0370117 A1 | 12/2019 | Fruchtman et al. |
| 2019/0384884 A1* | 12/2019 | Thuries ................ G06F 30/392 |
| 2020/0006306 A1* | 1/2020 | Li ............................ H01L 25/50 |
| 2020/0051990 A1 | 2/2020 | Harari et al. |
| 2020/0075534 A1 | 3/2020 | Gao et al. |
| 2020/0098738 A1* | 3/2020 | Herner ................ H01L 27/0688 |
| 2020/0098779 A1 | 3/2020 | Cernea et al. |
| 2020/0176468 A1 | 6/2020 | Herner et al. |
| 2020/0227123 A1 | 7/2020 | Salahuddin et al. |
| 2020/0243486 A1 | 7/2020 | Quader et al. |
| 2020/0258897 A1 | 8/2020 | Yan et al. |
| 2020/0326889 A1 | 10/2020 | Norman et al. |
| 2020/0328180 A1 | 10/2020 | Cheng et al. |
| 2020/0341838 A1* | 10/2020 | Hollis ................ G06F 11/1008 |
| 2020/0395328 A1* | 12/2020 | Fastow ............... G11C 16/0483 |
| 2021/0247910 A1 | 8/2021 | Kim et al. |
| 2021/0248094 A1 | 8/2021 | Norman et al. |
| 2021/0265308 A1 | 8/2021 | Norman et al. |

FOREIGN PATENT DOCUMENTS

| | | |
|---|---|---|
| CN | 108649031 A | 10/2018 |
| EP | 3916784 A1 | 12/2021 |
| KR | 20120085591 A | 8/2012 |
| WO | 2018236937 A1 | 12/2018 |

OTHER PUBLICATIONS

"European Search Report, EP 16852238.1", dated Mar. 28, 2019.
"European Search Report, EP17844550.8", dated Aug. 12, 2020, 11 pages.
"Invitation to Pay Additional Fees (PCT/ISA/206), PCT/US2020/015710", Mar. 20, 2020, 2 pages.
"Notification of Reasons for Refusal, Japanese Patent Application 2018-527740", datedNov. 4, 2020, 8 pages.
"Partial European Search Report EP 16869049.3", dated Jul. 1, 2019, pp. 1-12.
"PCT Search Report and Written Opinion, PCT/US2018/038373", dated Sep. 10, 2018.
"PCT Search Report and Written Opinion, PCT/US2019/014319", dated Apr. 15, 2019.
"PCT Search Report and Written Opinion, PCT/US2019/052164", dated Feb. 27, 2020.
"PCT Search Report and Written Opinion, PCT/US2019/052446", dated Dec. 11, 2019.
"PCT Search Report and Written Opinion, PCT/US2020/015710", dated Jun. 9, 2020.
"PCT Search Report and Written Opinion, PCT/US2020/017494", dated Jul. 20, 2020, 13 pages.
"PCT Search Report and Written Opinion, PCT/US2020/065374", dated Mar. 15, 2021, 17 pages.
"PCT Search Report and Written Opinion, PCT/US2021/016964", dated Jun. 15, 2021, 19 pages.
Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.
Kim, N., et al., "Multi-layered Vertical gate NANO Flash Overcoming Stacking Limit for Terabit Density Storage", Symposium on VLSI Tech. Dig. of Technical Papers, 2009, pp. 188-189.
Lue, H.T., et al., "A Highly Scalable 8-Layer 3D Vertical-gate {VG} TFT NANO Flash Using Junction-Free Buried Channel BE-SONOS Device", Symposium on VLSI: Tech. Dig. of Technical Papers, 2010, pp. 131-132.
Tanaka, T., et al., "A 768 GB 3b/cell 3D-Floaling-Gate NANO Flash Memory", Digest of Technical Papers, the 2016 EEE International Solid-Slate Circuits Conference, 2016, pp. 142-144.
Wann, H.C., et al., "High-Endurance Ultra-Thin Tunnel Oxide in Monos Device Structure for Dynamic Memory Application", IEEE Electron Device letters, vol. 16, No. 11, Nov. 1995, pp. 491-493.
"Partial Search Report, European Patent Application No. 20748610.1", dated Sep. 29, 2022, 13 pages.
"PCT Search Report and Written Opinion, PCT/US2022/15497", dated Jul. 11, 2022, 20 pages.

\* cited by examiner

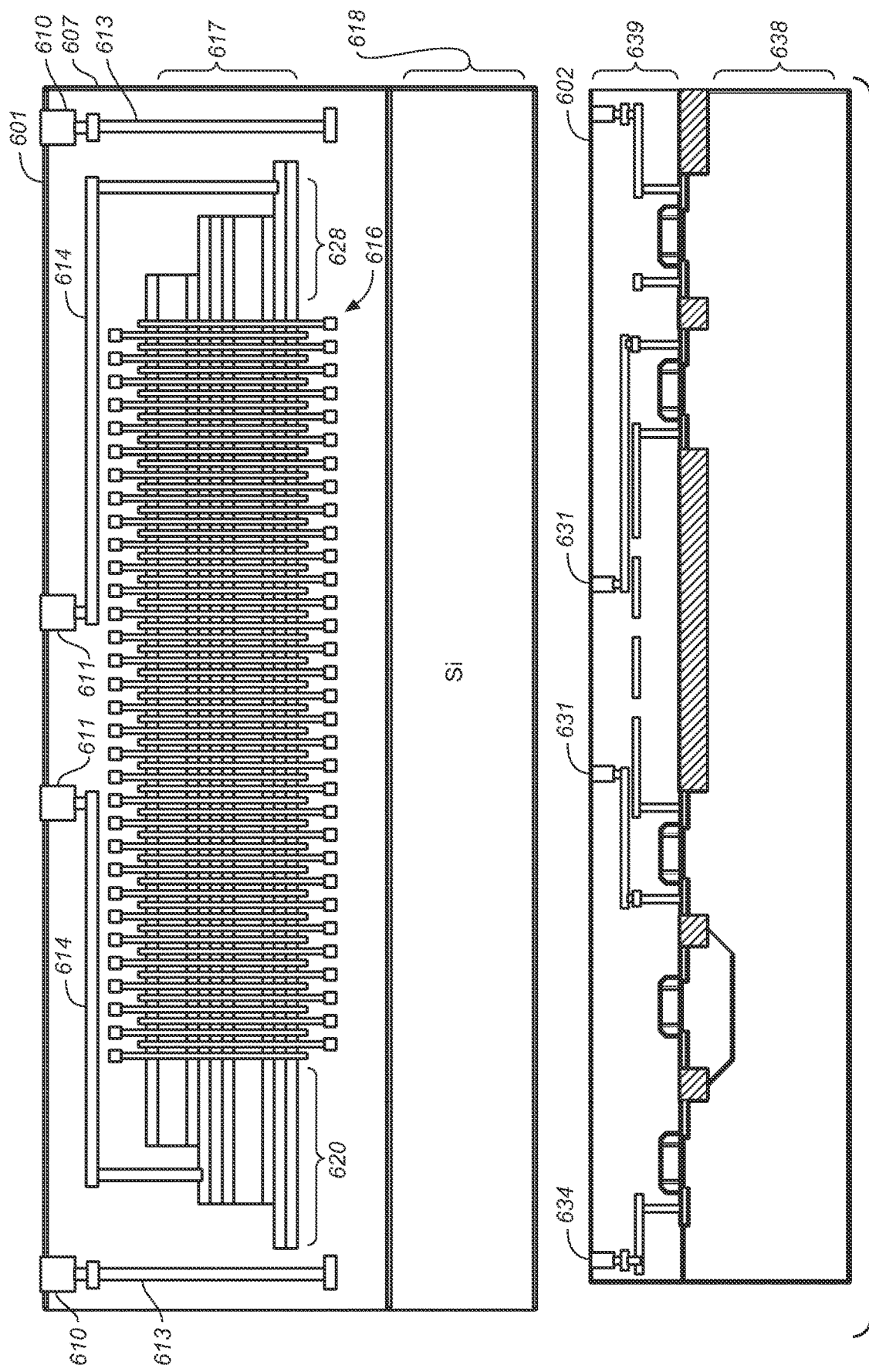

MEMORY DEVICE INCLUDING MODULAR MEMORY UNITS AND MODULAR CIRCUIT UNITS FOR CONCURRENT MEMORY OPERATIONS

CROSS REFERENCE TO RELATED APPLICATIONS

The present application is related to (i) U.S. patent application ("Non-Provisional Application I"), Ser. No. 16/012,731, entitled "3-Dimensional NOR Memory Array Architecture and Methods for Fabrication Thereof," filed Jun. 19, 2018; (ii) U.S. patent application ("Non-Provisional Application II"), Ser. No. 16/107,732, entitled "Three-dimensional vertical NOR Flash Thin-Film Transistor Strings," filed on Aug. 21, 2018; and (iii) U.S. patent application ("Non-Provisional Application II"), Ser. No. 16/579,329, entitled "Wafer Bonding in Fabrication of 3-Dimensional NOR-memory Circuits," filed on Sep. 23, 2019, which claims priority of U.S. provisional application ("Provisional Application I"), Ser. No. 62/735,678, entitled "Wafer Bonding in Fabrication of 3-Dimensional NOR-memory Circuits," filed on Sep. 24, 2018.

The present application is a continuation of U.S. patent application (i) 16/776,279, entitled "Device with Embedded High-Bandwidth, High-Capacity Memory using Wafer Bonding," filed Jan. 29, 2020, now U.S. Pat. No. 11,670,620, issued Jun. 6, 2023, which is related to and claims priority of (ii) U.S. provisional application ("Provisional Application II"), Ser. No. 62/798,673, entitled "Device with Embedded High-Bandwidth, High-Capacity Memory using Wafer Bonding," filed on Jan. 30, 2019; (ii) U.S. provisional application ("Provisional Application III"), Ser. No. 62/803,689, entitled "Device with Embedded High-Bandwidth, High-Capacity Memory using Wafer Bonding," filed on Feb. 11, 2019; and (iv) U.S. provisional application ("Provisional Application V"), Ser. No. 62/843,733, entitled "Device with Embedded High-Bandwidth, High-Capacity Memory using Wafer Bonding," filed on May 6, 2019.

The present application is also related to U.S. provisional application ("Provisional Application IV"), Ser. No. 62/735,662, entitled "Epitaxial Monocrystalline Channel for Storage Transistors in 3-Dimensional Memory Structures and Methods for Formation Thereof," filed on Sep. 24, 2018.

The disclosures of the Non-provisional Applications I and II (collectively, the "Non-provisional Applications") and the Provisional Applications I-V (collectively, the "Provisional Applications") are hereby incorporated by reference in their entireties.

BACKGROUND OF THE INVENTION

1. Field of the Invention

The present invention relates to high-performance computing. In particular, the present invention relates to creating a high-performance electronic device by providing logic integrated circuit access to a high-bandwidth, high-capacity memory device using wafer bonding.

2. Discussion of the Related Art

The Non-provisional Applications disclose 3-dimensional memory structures ("3-D NOR memory arrays") formed on top of a planar monocrystalline semiconductor substrate. (Collectively, the 3-D NOR memory arrays on a single semiconductor substrate is referred to, hereinunder, as a "3-D NOR memory chip"). In one example, each 3-D NOR memory array on a 3-D NOR memory chip is organized as 3-dimensional array of thin-film storage transistors, with the thin-film storage transistors along one of the directions organized as one or more NOR memory strings. In this context, the term "NOR memory string" refers to a group of thin-film storage transistors sharing common source and drain regions. In Non-provisional Application I, each NOR memory string has its thin-film storage transistors formed along a direction parallel to the planar semiconductor substrate. In Non-provisional Application II, each NOR memory string has its thin-film storage transistors formed along a direction perpendicular to the planar semiconductor substrate.

The semiconductor substrate underlying the 3-D NOR memory arrays in the Non-provisional Applications may include CMOS circuitry provided for supporting memory operations. The thin-film storage transistors of each 3-D NOR memory array may be interconnected to the underlying support circuitry by one or more layers of conductors ("global interconnect layers") provided between the memory structure and the semiconductor substrate or above the memory structure.

State-of-the-art dynamic random-access memory ("DRAM") arrays are typically formed at the surface of a planar semiconductor substrate. As such, the 2-dimensional silicon "real estate" on the planar semiconductor substrate must be shared between its DRAM memory arrays and their support circuitry. Both the inability to form a 3-dimensional array of memory cells and having to form support circuitry on precious silicon real estate result in DRAM arrays having a much lower density per unit area of silicon substrate than the 3-D NOR memory arrays of the Non-provisional Applications. In other words, a 3-D NOR memory chip has far higher capacity than a DRAM integrated circuit fabricated on a silicon die of comparable size.

Wafer bonding (or die-bonding) is a technique used in the manufacturing of semiconductor devices. In wafer bonding, semiconductor dies are joined, for example, by thermocompression, adhesive, anodic, or thermal techniques. Provisional Application I discloses numerous examples of interconnecting devices on two or more semiconductor dies using a "flip-chip" (or "flip-wafer") wafer bonding technique. Specifically, Provisional Application I discloses examples in which one or more of the wafer-bonded semiconductor dies have fabricated thereon the memory structures of the Non-provisional Applications. Under the "flip-chip" technique, conductor-filled vias or conductive posts ("studs") are exposed at the top surface of each semiconductor die to allow electrical access to the devices formed under the surface in the semiconductor die. Suitable conductors to be used as studs include, for example, copper. When two such semiconductor dies are wafer-bonded, their exposed studs come into contact with each other, thereby interconnecting devices across the wafer-bonded semiconductor dies. FIG. 7(a) illustrate one type of such stud connections. As shown in FIG. 7(a), numerous studs 701-1, 701-2, . . . , 701-n (collectively, studs 701) are provided between semiconductor dies 702 and 703. In this implementation, studs 701 result from mating of male-female portion, as illustrated by stud 701-1. Portion 701-1a of stud 701-1 is formed on a surface of semiconductor die 702 and includes accessible cavity 705. Portion 701-1b of stud 701-1 is formed on semiconductor die 703 and includes a protrusion 704 that fits hand-in-glove into cavity 705.

In the prior art, communication over pins between wire-bonded circuits (or between packaged circuits) is not only limited in bandwidth by the number of pins available for wire-bonding (or on the packages), driving a signal between pins across a wire-bond or between two package pins requires much power and incurs a substantial delay because of the large capacitances involved. Driving a signal across the wafer-bonded semiconductor dies over abutting studs does not have these limitations.

Besides the "flip-chip" technique, other techniques for interconnecting circuits in different wafer-bonded semiconductor dies have been developed. Under one technique, commonly referred to as the "Through-Silicon-Via" (TSV) technique. In the TSV technique, multiple conductor-filled vias are provided that extend the entire thickness of each semiconductor die, such that, when the semiconductor dies are stacked one on top of another, the conductor-filled vias abut each other to provide a network of conductors through which electrical interconnection between devices formed on different semiconductor dies are made. Under the TSV technique, because the conductors carrying signals across the semiconductor dies are aligned to allow signals to be routed between any two of the stacked semiconductor dies, the TSV are typically provided at the periphery of each stacked die, and often driven from conventional I/O pads (e.g., in a conventional DRAM bus organization). The flip-chip technique is less costly in silicon real estate and enables great flexibility and options in organizing the interfaces between the wafer-bonded dies beyond conventional bus structures. FIG. 7(b) illustrates the TSV technique using a cross section of semiconductor die 711. As shown in FIG. 7(b), one implementation includes numerous vias 712 (represented by vias 711-1, 711-2, 711-3 and 711-4) formed in semiconductor die 711 using conventional etching techniques and are thereafter filled with conductive material (e.g., tungsten). On both ends of each via and exposed to the opposite sides of semiconductor die 711 are formed bonding pads—indicated by bonding pads 713a and 713b—for connections either with circuitry formed on one of the surfaces of semiconductor die 711, or through a wafer bond to circuitry on another semiconductor die or to other external circuitry.

Under another technique, commonly referred to as the "silicon interposer" technique, two or more semiconductor dies are each wafer-bonded in a "flip-chip" fashion to a large silicon substrate (i.e., the "silicon interposer"). The silicon interposer provides a network of interconnect conductors to connect the studs of the semiconductor dies. Under the "silicon interposer" technique, the surface area on the silicon interposer that abuts the wafer-bonded semiconductor is greater than the total surface areas of its wafer-bonded semiconductor dies.

A variation of the "silicon interposer" technique, referred to as the "silicon bridge" technique. Under the "silicon bridge" technique, each semiconductor die to be wafer-bonded has its studs for interconnection of devices placed on specific locations along one or more designated edges of the semiconductor die. Studs for power and ground signals may be separately provided outside of these locations. The semiconductor dies are then placed "face-down" on a surface of a circuit board, such that their respective designated edges of interconnection studs are in close vicinity of each other. In-laid in the circuit board is a silicon substrate (i.e., the silicon bridge) which provides a network of conductor to interconnect the studs of the semiconductor dies. The semiconductor dies are then wafer-bonded to the silicon bridge. In this manner, unlike the interposer technique, the silicon bridge need only overlay that close vicinity of interconnect studs. Outside of the silicon bridge, the circuit board provide separate access to power and ground planes.

A "High-Bandwidth Memory" (HBM) Standard (JESD235) has been promulgated by the standard organization JEDEC. Under the HBM standard, a high-bandwidth memory device is achieved by stacking up to eight DRAM dies and, optionally, a base "logic" die with a memory controller, which are interconnected by TSV and micro-bumps. Essential features of the HBM Standard is disclosed in Highlights of the High-Bandwidth Memory (HBM) Standard, at the Memory Forum, Jun. 14, 2014, available from Nvidia Corporation. Under the HBM standard, the DRAM dies provide a number of completely independent data interfaces ("channels"), with each channel providing a 128-bit bus interface that is similar to a conventional DDR bus interface. HBM addresses the pin-out bottleneck by bonding a stack of memory wafers or dies to another semiconductor die (e.g., a logic circuit) using an interposer wafer using the TSV technique. Using an eight-wafer stack, HBM can increase the memory pin-out by a factor of eight (e.g., 128 or 256 output signals). Significant silicon "real estate" is required to implement the data interfaces under HBM.

SUMMARY

According to one embodiment of the present invention, an electronic device with embedded access to a high-bandwidth, high-capacity fast-access memory includes (a) a memory circuit fabricated on a first semiconductor die, wherein the memory circuit includes numerous modular memory units, each modular memory unit having (i) a three-dimensional array of storage transistors, and (ii) a group of conductors exposed to a surface of the first semiconductor die, the group of conductors being configured for communicating control, address and data signals associated the memory unit; and (b) a logic circuit fabricated on a second semiconductor die, wherein the logic circuit also includes conductors each exposed at a surface of the second semiconductor die, wherein the first and second semiconductor dies are wafer-bonded, such that the conductors exposed at the surface of the first semiconductor die are each electrically connected to a corresponding one of the conductors exposed to the surface of the second semiconductor die. The three-dimensional array of storage transistors may be formed by NOR memory strings. The memory circuit may be, at least in part, a quasi-volatile memory circuit having an endurance capable of a million or more write-erase cycles. The wafer bonding may be achieved preferably using a flip-chip or flip-wafer technique; alternatively, other wafer-bonding techniques, such as TSV, silicon interposer or silicon bridge techniques, may be used in lieu of or in conjunction with the flip-chip technique.

According to one embodiment of the present invention, the modular memory units are formed above a planar substrate of the first semiconductor die and placed in a regular configuration. The regular configuration may arrange the memory units along rows and columns, such that the modular memory units may be configured according to a memory segmentation scheme into memory segments that are independently addressable (a) by memory unit individually, (b) row-by-row, or (c) block-by-block, wherein each block of memory units consists of memory units within a predetermined number of rows and a predetermined number of columns. Memory segmentation may be achieved using configuration cells, which stored values configure signal paths for connecting the control, address and data signals of the memory units to their respective groups of conductors according to the memory segmentation scheme. Alternatively, anti-fuses may be used to set the configuration. The signal paths may be implemented by a network of switches (e.g., transmission gates) interconnecting a network of conductors. The configuration cells may be made field-programmable.

According to one embodiment of the present invention, the modular memory units includes a data processing circuit that processes data (e.g., error correction and check-bit generation) to be stored into or read from the modular units. In one implementation, the modular memory units are placed on opposite sides of the data processing circuit. In one embodiment, the modular memory units are assigned to different memory segments, with each memory segment being provided a separate portion of the data processing circuit for data processing.

In one embodiment, the memory circuit includes a quasi-volatile memory (QVM) circuit. In another embodiment, the memory circuit may include both QVM circuitry and non-volatile memory (NVM) circuitry on the same semiconductor die. The QVM of the present invention has short read, erase and write latencies, preferably comparable or approaching those of DRAM, and an erase-write cycle endurance that is one or more orders of magnitude greater than conventional NAND flash memory or 3-D NAND flash memory.

According to one embodiment of the present invention, a data processing circuit in the logic circuit provides data processing (e.g., error correction and check-bit generation) for data read from or to be stored into the memory circuit. The logic circuit may include custom logic circuits, such as microprocessors (e.g., RISC-type processor or graphics processing units). In addition, the logic circuit may be provided one or more of: industry standard data interfaces, and field programmable logic devices.

According to one embodiment, both the memory circuit and the logic circuit may be segmented, and their resources paired by segments to allow parallel computing operations. Such an organization provides great advantage in some applications, such as multi-processor system (e.g., multiple core CPUs or GPUs) on the logic circuit, with each processor being paired with one or more corresponding memory segments in the memory circuit, neural networks, as well as other artificial intelligence-related circuitry. These segments may also be organized as a data pipeline to implement a sequence of related operations each receiving as input data resulting from a previous operation and temporarily stored on its memory segment.

According to one embodiment of the present invention, the modular memory arrays may be used as programmable logic circuits implemented as look-up tables, According to one embodiment of the present invention, the electronic device may implement a storage system controller circuit, which includes (i) a storage controller for managing a storage system (e.g., a hard disk system or a NAND flash storage system); and (ii) a flash controller for managing a flash cache memory for the storage system, wherein the flash controller includes a memory circuit wafer-bonded to a logic circuit. In one embodiment, the logic circuit in the flash controller includes a memory controller for the memory circuit, which may include QVM and NVM circuits. The memory controller in the logic circuit may have an industry standard data interface, such as a DRAM interface, so that the memory controller may be accessed in the same manner as a DRAM controller. The industry standard bus interface may also be a PCI/e interface. The memory controller may further implement an interface to a NAND flash memory circuit, to allow the NAND flash memory to interact with the QVM cache memory for the storage system.

The present invention is better understood upon consideration of the detailed description below, in conjunction with the accompanying drawings.

BRIEF DESCRIPTION OF THE DRAWINGS

For clarity of presentation and to allow cross referencing among the figures, like elements in the figures are assigned like reference numerals.

DETAILED DESCRIPTION OF THE PREFERRED EMBODIMENTS

Figure 1A:
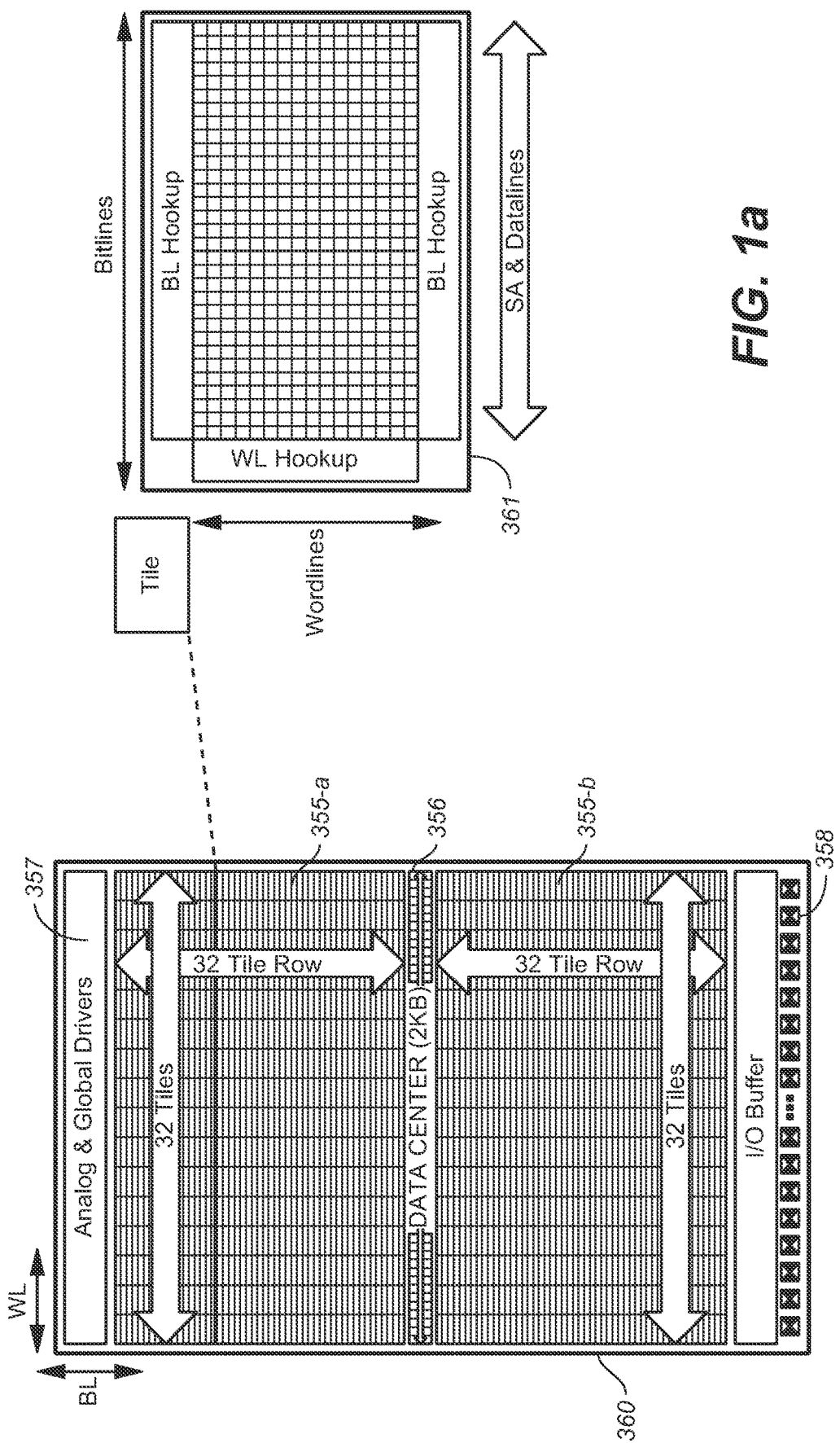
FIG. 1a shows a floor plan of semiconductor die 360 that includes memory circuit 355 made up by arrays 355a and 355b of tiles, suitable for use in one embodiment of the present invention.

A powerful electronic device of the present invention is formed by combining a memory circuit fabricated on one semiconductor die (e.g., a 3-D NOR memory chip) with a complex logic circuit (e.g., a memory controller, one or more multi-core processor, a field programmable logic circuit, or a neural network) formed on a second semiconductor die using a wafer-bonding or die-bonding technique. Preferably, the memory circuit comprises one or more regular arrays of addressable modular structures or building blocks of memory cells ("tiles") placed in a regular manner. The modularity allows the memory circuit to be segmented into independently addressable memory segments. For example, a memory segment of a desired size (e.g., a row of 32 tiles) may be achieved by configuring a group of tiles to form the memory segment, as desired.

The present invention is particularly advantageous when the memory circuit is one of the high-capacity and fast-access memory circuits disclosed in the Non-Provisional Applications. Some of the memory arrays disclosed therein may be configured as non-volatile memory (NVM) circuits with a long data-retention time (e.g., tens of years). The Non-provisional Applications also disclose examples of quasi-volatile memory (QVM) circuits that have a shorter data-retention time (e.g., up to tens of minutes), but faster access time (e.g., less than 100 nanoseconds). Because of their fast access times, such QVM memory circuits may be used as run-time memory, comparable to DRAMs. The NVM and QVM of the Non-provisional Applications may be organized as NOR memory strings which contribute to a read data-access time that is significantly faster than conventional NAND flash memory strings. For example, the NVM and QVM disclosed in Non-provisional Application I may be read in approximately 100 ns, compared to 50 microseconds for a NAND flash array. Furthermore, while a conventional NVM memory cell may have an endurance of less than 100,000 write-erase cycles, a thin-film storage transistor of a QVM circuit of the Non-provisional Applications have an endurance in excess of $10^9$-$10^{11}$ write-erase cycles, providing high tolerance to wear-out degradation. QVM is thus more suitable than NVM for memory caching applications where a high erase/write cycle count can quickly exceed the relatively low endurance limit of NVM.

When used as run-time memory, a QVM circuit requires much less frequent refreshes than a DRAM circuit. As 3-D NOR memory arrays, the QVM circuits have a higher capacity and a lower cost than DRAMs. With their fast-access and high endurance, QVMs are thus more suitable than NVMs for memory caching applications where a high erase/write cycle count can quickly exceed the relatively low endurance limit of NVM. It is possible to have both QVM and NVM memory arrays configured on the same memory chip. Also, such NVM and QVM circuits may each be multi-state (i.e., storing more than one data bit may be represented in each memory cell).

A QVM circuit, as discussed herein, is a dynamic memory requiring refresh. Compared to DRAM, however, the QVM circuits of the present invention have very small leakage of the stored charge, so that the required refresh rate is much less than that of DRAMs of comparable capacity, thereby the QVM circuits are lower power.

The advantages of a memory circuit disclosed in the Non-Provisional Applications include both high-capacity and fast access. In some of the embodiments therein, such a memory circuit can be used as non-volatile memory (NVM) because of the long data retention time (e.g., tens of years); in other embodiments, some of the memory ("quasi-volatile memory" or QVM) can be used as run-time memory—similar to DRAM—because of its fast access times. The NVM and QVM of the current invention may be constructed as three-dimensional NOR memory strings of thin-film storage transistor strings, which provide a read data access time that is significantly faster than conventional NAND flash memory arrays. For example, the NVM and QVM disclosed in Non-provisional Application I may be read in approximately 100 ns, compared to 50 microseconds for a NAND flash array.

Compared to DRAMs, QVMs leak significantly less of their stored charge, so that QVMs require a less frequent refresh rate than DRAMs, and thus QVMs operate with significatnly lower power than DRAMs. While conventional DRAMs are refreshed at a millisecond-range (e.g., 64 ms under DDR2), QVMs may require refresh at a minute-range (e.g., every 10 minutes). By virtue of their three-dimensional organization (i.e., stacks of memory arrays), as illustrated, for example, in Non-provisional Application I, the QVM circuits have a higher capacity and a lower cost than DRAMs.

Using the flip-chip or flip-wafer technique, signals may be driven across the wafer-bonded semiconductor dies over the conductive posts or studs that connect between the memory circuitry in one semiconductor die and the logic circuitry of the other semiconductor die. As the connection through the studs are relatively low in capacitance, these connections are low-power and low-latency. Without the constraint of conventional input/output circuitry, a large number of studs (e.g., at least tens of thousands) may be provided over the surface of each semiconductor die, distributed substantially uniformly over the wafer-bonded surface area. The interface under the present invention between the memory circuit and the logic circuit circumvents the package pin-limitations of the prior art, allowing potentially tens of thousands of bits or more to be transferred simultaneously across the semiconductor dies. Hence, an electronic device of the present invention has the advantages of a large embedded high-bandwidth interface, much like an internal data highway with tens of thousands or more lanes of electrical connections for a highly distributed high-capacity memory.

In general, the high capacity, fast access time and high endurance available in a QVM circuit, coupled with the high-bandwidth provided by wafer-bonding such a QVM circuit to a processor circuit, enables a powerful electronic device with a high-capacity memory that functions effectively as a large embedded memory, despite the fact that the QVM circuit physically resides on a different wafer or die and not embedded within the semiconductor die on which the processor circuit is formed. The present invention enables or provides significant advantages in many applications, including, for example, artificial intelligence. The electronic devices of the present invention are shown to provide higher bandwidth and lower power than conventional DRAM-based von-Neuman architecture processor systems of comparable memory access times.

FIG. 1a shows a floor plan of semiconductor die 360 that includes memory circuit 355 made up of building blocks referred herein as tiles. In the description herein, each tile can be configured to be individually and independently addressed ("tile-specific basis"). At the user's option, larger memory segments (e.g., a row of tiles or a 2-dimensional block of tiles) may be created and configured to be addressed together (e.g., "row-specific" addressing, or "core-specific" addressing). In any of these organization, the addressable unit may be referred to as a "bank," so that the addressing scheme may be described as "bank-specific". FIG. 1a shows memory circuit 355 being divided into two cores 355a and 355b, each core being a 32-row×32-column array of tiles in this instance. Cores 355a and 355b sharing local data center 356, where circuits for data selection and for connections to support circuitry may be provided. Examples of support circuitry include error-correction encoders and decoders, address decoders, power supplies, check-bit generators, sense amplifiers, and other circuits used in memory operations. Support circuitry may be formed in the planar semiconductor substrate. In one embodiment, the support circuitry for the thin-film storage transistors of each tile is provided for modularity in the portion of the semiconductor substrate underneath each tile. In FIG. 1a, analog and global driver circuits 357 for signal distribution are formed at one end of semiconductor die 360, and I/O buffer circuits 358 for access to memory circuit 355 is formed at the other end of semiconductor die 360. I/O buffers 358 are provided for sending signals to and receiving signals from an external circuit, when not accessed over the studs. As discussed below, the tiles are modularly designed to include the studs exchanging receiving data and address signals with the wafer-bonded logic circuit over the studs without constraints by I/O buffer 358. FIG. 1a also shows tile 361, which consists of a 3-D NOR memory array, with the thin-film transistors in each constituent NOR memory string formed along a direction parallel to the planar semiconductor substrate. FIG. 1a shows that the bit lines and global word lines run orthogonally, with local word lines branching-off each global word line and extending along an orthogonal direction perpendicular to the planar semiconductor substrate. As mentioned, the sense amplifiers for each 3-D memory array are formed in the monocrystalline silicon substrate underneath the tile and provide data lines to deliver the output datum.

Although the QVM (and NVM, if present) circuits in the embodiment of FIG. 1a are formed with all the control, sensing, power, input/output and other memory-related functions residing on the memory die itself, it is possible in some other embodiments to have some of these functions physically reside on the processor circuit die. For example, the DDR3/DDR4 or PCIe or other high-speed data interface, or the high voltage transistors required to program or erase the QVM memory, may require analog or high-speed digital transistors and logic circuits that are process-wise incompatible with the thermal budget encountered in the fabrication of the 3-D NOR memory arrays making up the QVM. These circuits may therefore best be placed on the wafer-bonded logic or processor die. The same considerations may apply to other circuits, such as error correcting circuits, arithmetic logic unit circuits, exclusive or circuits, control circuits and state machines. In fact, such circuits may be shared by multiple QVM or NVM dies, and therefore such circuits are most cost-effective at the system level when provided from the processor die over the connections through the stud connectors to each of the individual QVM dies.

Figure 1B:
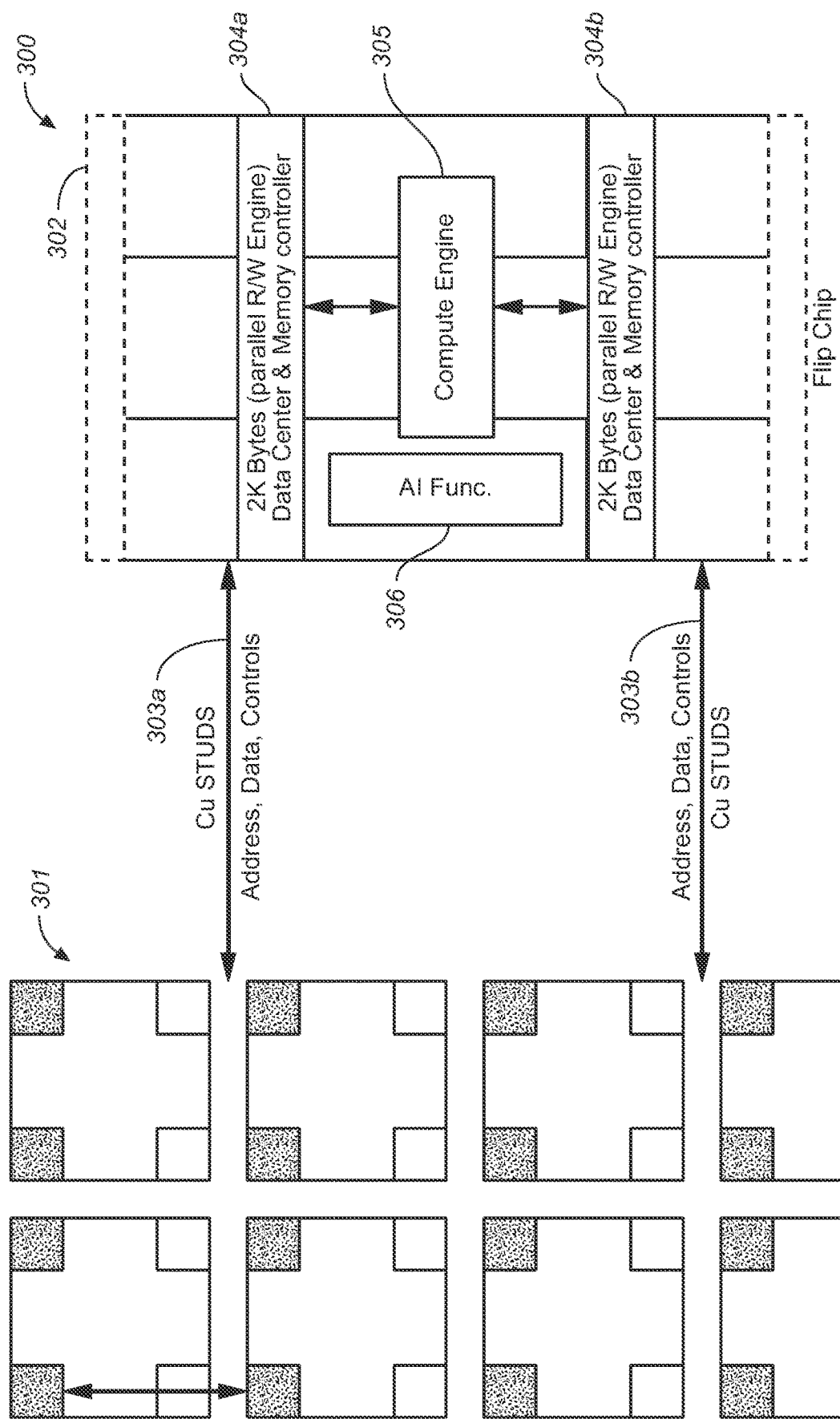
FIG. 1b shows system 300, which includes QVM circuit 301 that is wafer-bonded to processor circuit 302 using a flip-chip or flip-wafer technique, according to one embodiment of the present invention.

FIG. 1b shows system 300, which includes QVM circuit 301 that is wafer-bonded to processor circuit 302 using a flip-chip or flip-wafer technique, according to one embodiment of the present invention. As shown in FIG. 1b, QVM circuit 301 and processor circuit 302 have between them connected studs for two memory buses 303a and 303b, each capable of transferring 2048 bytes (i.e., 2 KB) of data, together with necessary address, check-bits and control signals, per memory cycle. Data transferred over memory buses 303a and 303b, each including close to 20,000 copper connection studs, are processed or prepared in data centers 304a and 304b, respectively. Data center 304a and 304b may also include a memory controller to control memory operations in QVM circuit 301. Computing engine 305, such as a single core or a multi-core processor (e.g., RISC-type processor, such as ARM, or a graphic processor), operates on the data retrieved from or to be written to QVM circuit 301. The high-bandwidth of 4 KB (i.e., 4096 bytes) each memory cycle over memory buses 303a and 303b provides enormous relief to the significant conventional problem of the "Von Neuman bottle neck." With the two memory buses 303a and 303b, simultaneously read and write-back operations can be carried out, which is very beneficial to applications in which a large amount of data are read from memory, processed and written back (e.g., rendering video data). In system 300, processor circuit 302 may also include custom hardware (e.g., AI module 306) for a specific application. For an artificial intelligence application, for example, AI module 306 may include a neural network circuit.

Figure 1C:
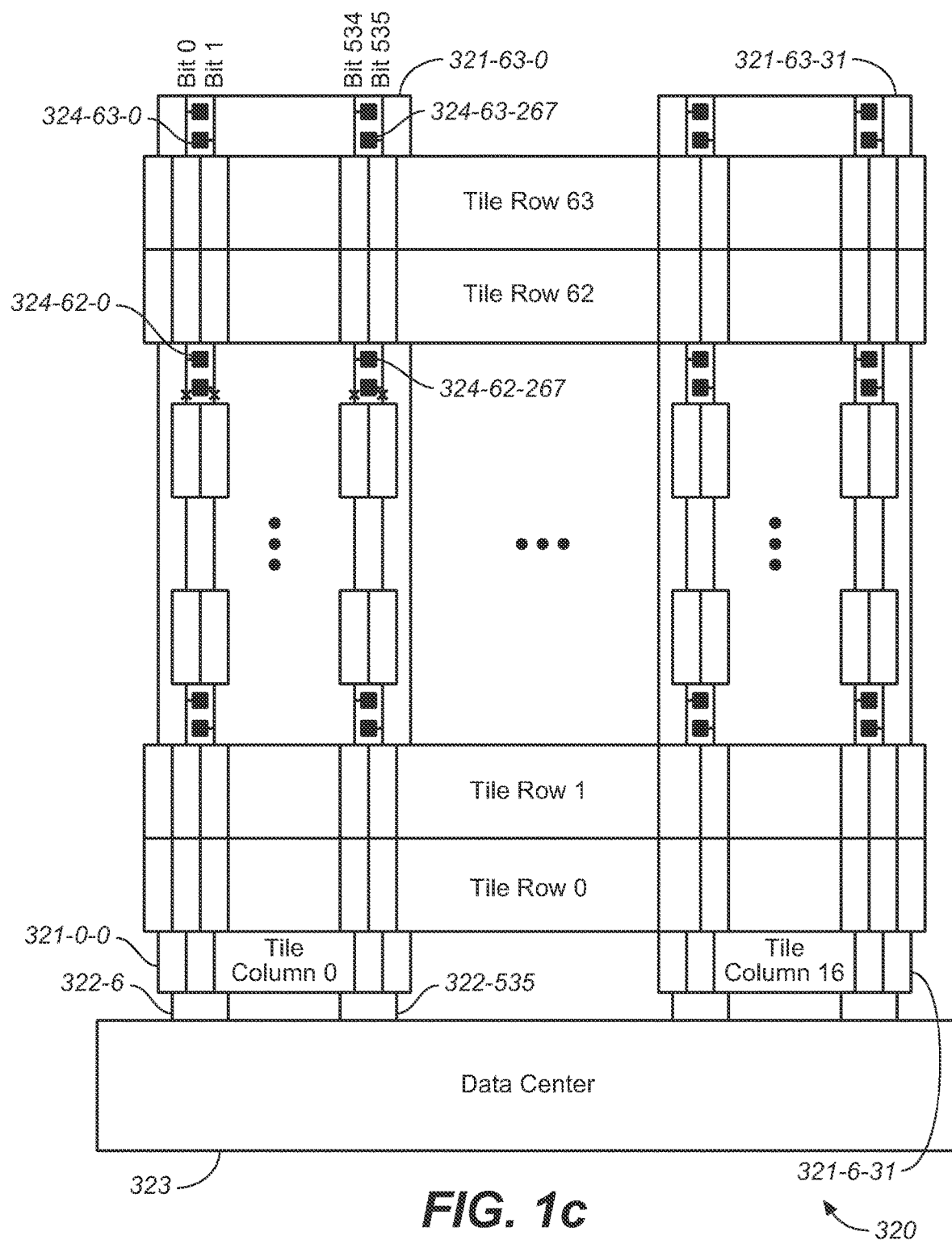
FIG. 1c shows memory circuit 320 which includes 64 rows by 32 columns "core" of tiles, suitable for implementing a portion of QVM circuit 301, in accordance with one embodiment of the present invention.

QVM circuit 301 may be configured in numerous ways. For example, FIG. 1c shows memory circuit 320 including 64 rows by 32 columns "core" of tiles, suitable for implementing a portion of QVM circuit 301, in accordance with one embodiment of the present invention. As shown in FIG. 1c, row 63 includes tiles 321-63-0 to 321-63-31 and row 0 includes tiles 321-0-0 to 321-0-31. In this embodiment, each tile represents an independently addressable 3-D NOR memory array consisting word lines, bit lines and a number of memory layers stacked one on top of another. In this embodiment, each tile receives and outputs a 536-bit datum, suitable for implementing 512 data bits together with 24 check-bits, or an error-correction encoded 536-bit code word. 536 sense amplifiers are provided in each tile to output the 536-bit output datum on 536 global bit lines that are multiplexed among each column of tiles. The 536 global bit lines (e.g., global bit lines 322-0 to 322-535) are shared by the 64 tiles in each column, running vertically to connect to data center 323. In this embodiment, each tile is provided 536 studs to allow parallel access from a wafer-bonded semiconductor die via the bit lines to the thin-film storage transistors of the NOR memory strings of the tile.

Memory circuit 320 thus provides 2048 Bytes of data, along with 768 check-bits, or 2048 Bytes of data in error-encoded code words. As shown in FIG. 1c, adjacent tiles in adjacent rows (e.g., adjacent tiles in rows 62 and 63) form tile-pairs, with each tile pair consisting of two tiles placed back-to-back (i.e., each being a mirror image to the other). A local bit line is provided for each bit to be stored or to be output from a tile, and a stud is shared between two local bit lines. For example, tile 321-63-0 of row 63 is provided studs 324-63-0 to 324-63-257 and tile 321-62-0 of row 62 is provided studs 324-62-0 to 324-62-257. In FIG. 1c, data center 323 is formed on the same semiconductor die as the 3-D NOR memory arrays. Alternatively, as shown in FIG. 1b, data centers 304a and 304b may provide all or at least some portions of the functions of data center 323.

It is understood that, although the memory circuit in the embodiment FIG. 1b is described as QVM circuit 301, such designation is provided merely for illustrative purposes only. The memory of FIG. 1a may have a NVM portion, for example. In one embodiment, selected tiles in the memory circuit are NVM, while other tiles form QVM circuit 301. In that regard, the wafer-bonding or chip-bonding configurations under the present invention for studs connecting a memory circuit and a processor circuit, including the programmable connectivity disclosed below for QVM, are equally applicable to such memory circuits as DRAMs, phase-change memories (e.g., 3-D XPoint memories), spin-transfer torque (STT) memory devices, resistive random-access memories (RRAMs), or ferroelectric random-access memories (FeRAM).

Figure 1D:
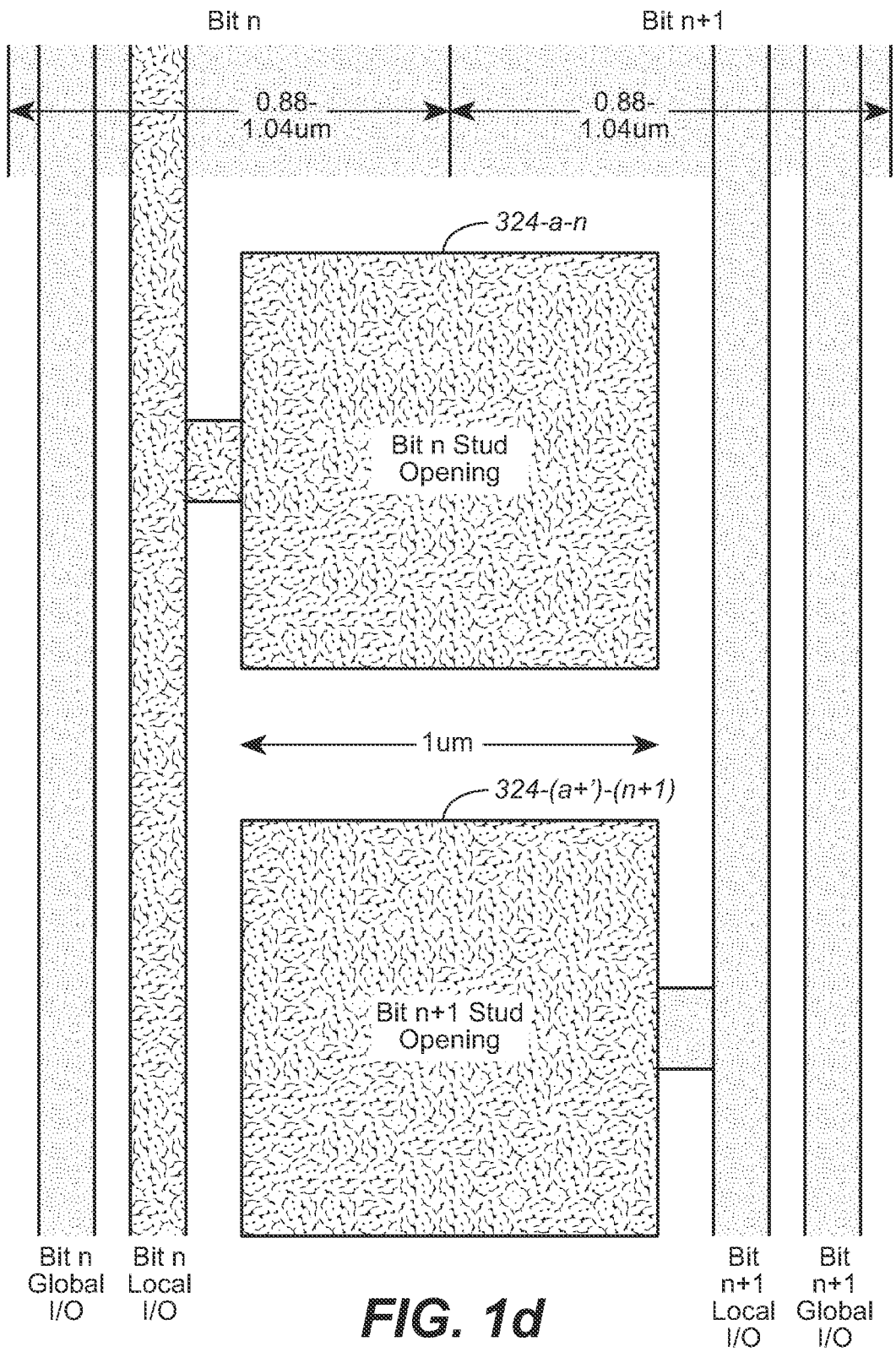
FIG. 1d is a magnified view of a portion of memory circuit 320, in which adjacent studs 324-a-n and 324-(a+1)-(n+1) provided to adjacent local bit lines for bits n and (n+1) between two tile-pairs.

FIG. 1d is a magnified view of adjacent studs 324-a-n and 324-(a+1)-(n+1) for adjacent local bit lines for bits n and (n+1) between two tile-pairs. In one embodiment, each stud may be approximately 1 μm wide or less.

Figure 1E:
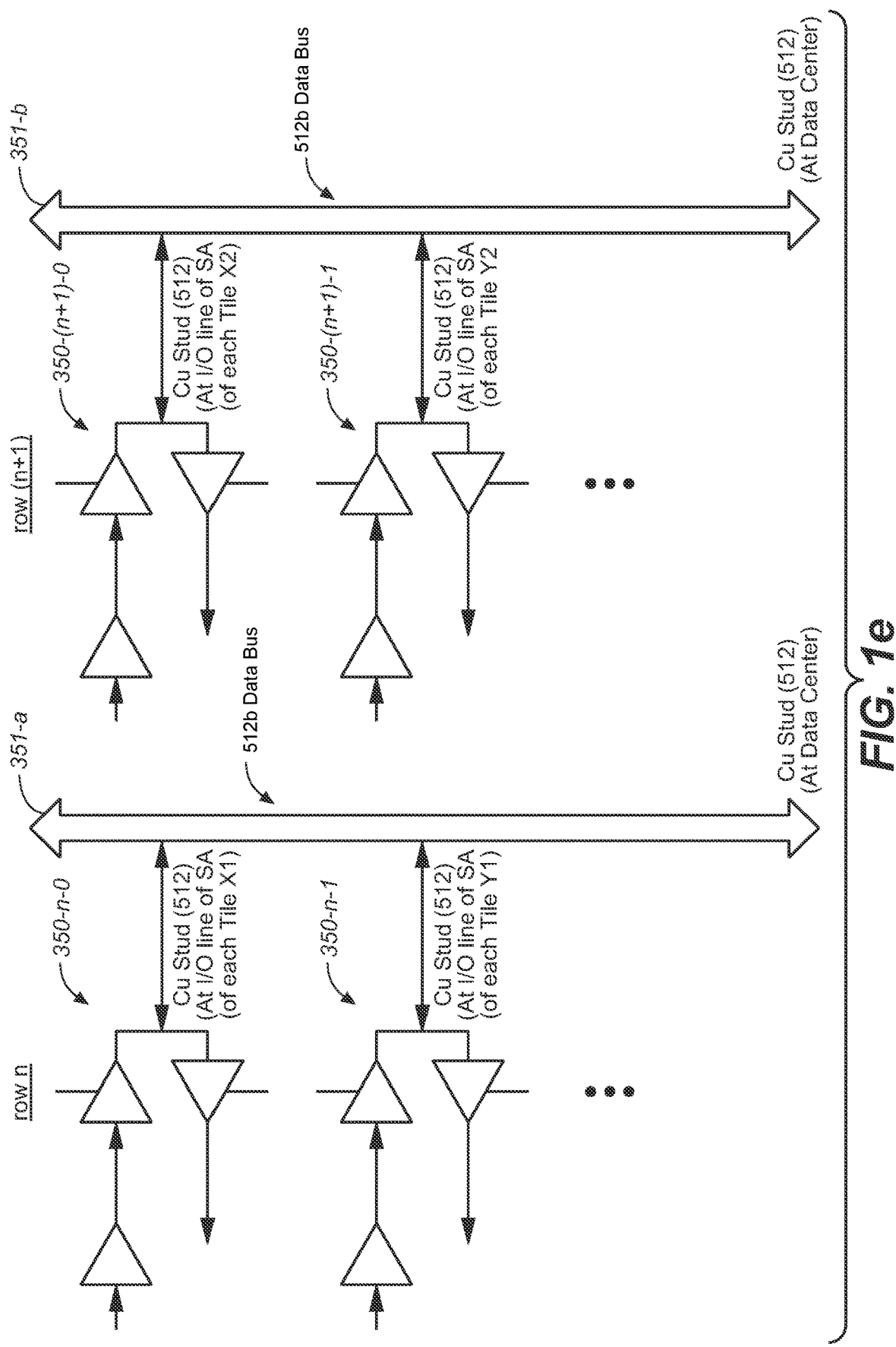
FIG. 1e illustrates tile-by-tile studs programmability at the memory tile-level and data path selection at the data center-level, in accordance with one embodiment of the present invention.

As mentioned above, the studs may be configured to be addressed by all tiles in a row simultaneously or tile-by-tile. FIG. 1e illustrates tile-by-tile studs programmability at the memory tile-level and data path selection at the data center-level, in accordance with one embodiment of the present invention. FIG. 1e illustrates the studs at memory tile row n, having tiles 350-n-0, 350-n-1, . . . 350-n-31, and row (n+1), having tiles 350-(n+1)-0, 350-(n+1)-1, 350-(n+1)-31, respectively. The stubs in each tile are driven from or received into the addressed memory cells of each tile at the I/O of line of sense amplifiers at the tile. Thus, the required driver is merely those between on-chip logic gates, which are much smaller than those required for conventional I/O pads, such as those required at the interfaces at each channel of an HBM. Further, in one embodiment of the present invention, the tiles of each row may be configured to be addressed tile-by-tile, in which case, the 512-bit datum of each tile (536-bit with error-correction coding or check-bits) may be directly driven onto, or receive from, 512-bit (536-bit) data bus 351-a or 351-b at the data center (e.g., data center 304a or 304b), for example. Alternatively, in one embodiment, selection logic may be configured to allow a data path to be selected for each of data bus 351a or 351b. In that configuration, at each row of tiles, one of 32 data paths may be selected to steer one of the 32 536-bit data from its tiles to data bus 351a or 351b. The configuration for tile-by-tile addressing or data path addressing may be achieved using, for example, anti-fuses or by a network of transmission gates each controlled by a configuration cell (e.g., a one-bit memory cell) holding a configuration bit. The studs may be made field programmable by allowing user write access to the configuration cells. Alternatively, programming may be achieved during manufacturing using a masking layer.

The flexibility in organizing and programming the stud structure allows multiple data paths to be configured between the memory and logic device, so that multiple memory accesses can take place concurrently, thus providing for overlapped operation. Furthermore, the interconnections and stud routing can be organized in any structure. For example, the input and output signals of any group of tiles are not constrained to be organized as a bus structure of a determined width, be multiplexed for sharing among the tiles, or share any common signaling scheme (e.g., sharing of address and data conventions). There is no restriction on data formats or data types that can be communicated between the logic circuit and the memory circuit, such that there is essentially arbitrary large connectivity with very high bandwidth.

Figure 1F:
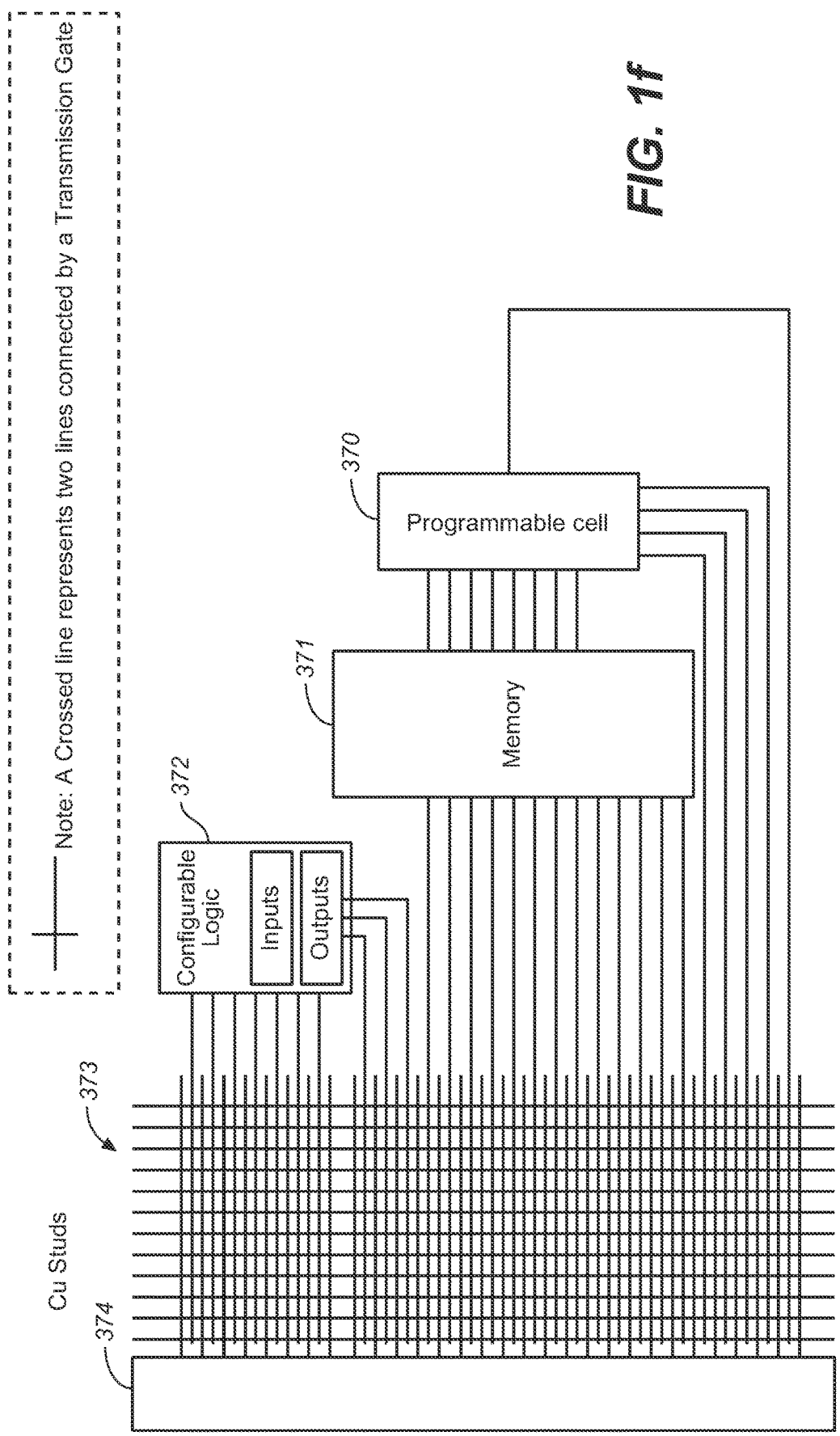
FIG. 1f is a schematic diagram illustrating configuration of studs, according to one embodiment of the present invention.

Figure if is a schematic diagram illustrating configuration of studs, according to one embodiment of the present invention. As shown in FIG. 1f, transmission gate network 373 allows interconnection of signals to the studs, allowing user-specified signals to be brought in over the studs and be connected into an array of signals in the memory circuit. Configuration logic 372 to allow configuring portions of the studs for input and for output (e.g., from the I/O line of sense amplifiers) signals, respectively. In addition, configuration cells 370 may be provided to set one of various organizations of the memory tiles (e.g., tile-specific, row-specific, bank-specific, or core-specific addressing, see below). Other organizations and programmable units (e.g., multiple tiles may be logically combined to create a larger addressable memory unit) are possible. The configured memory organization can thus respond the address signals in the desired manner. The configuration scheme illustrated in Figure if may be provided on both memory circuit 301 and logic circuit 302, so as to allow any input or output control signal, data signal or address signal to be routed between the two circuits, as desired.

Figure 1G:
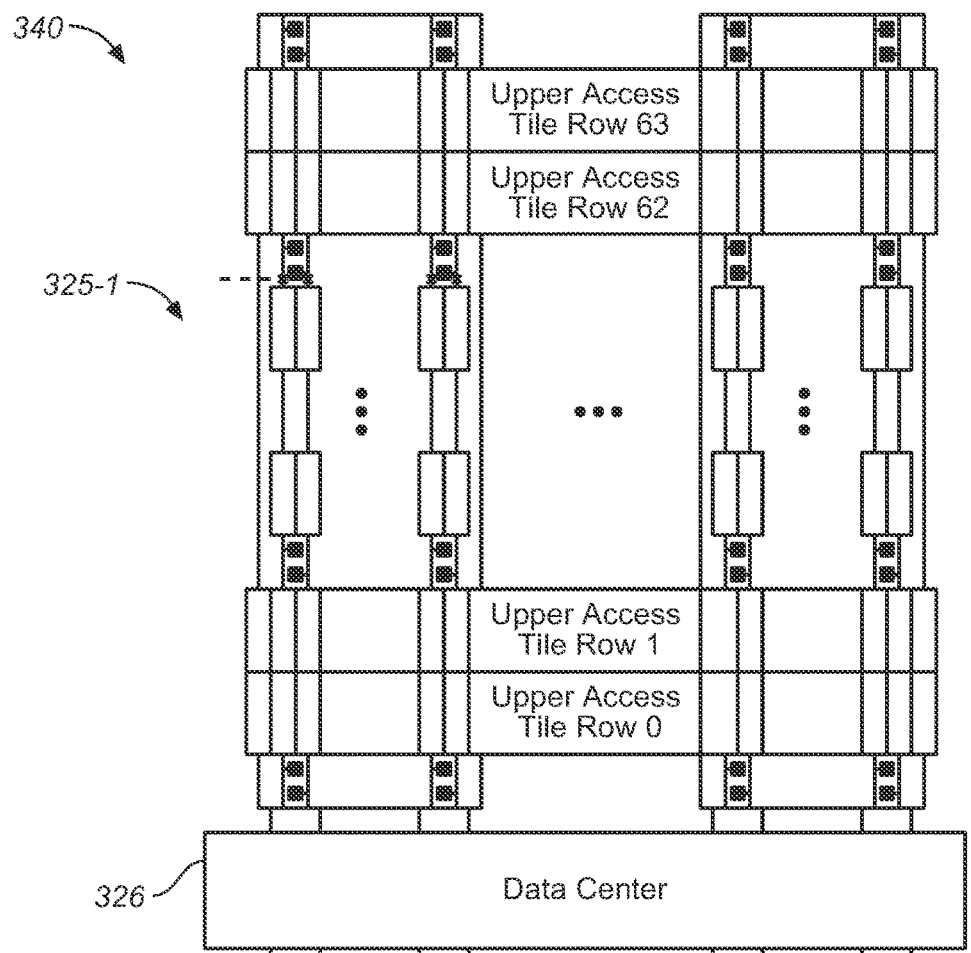
FIG. 1g shows memory circuit 340, which includes cores 325-1 and 325-2 that share data center 326, suitable for implementing a portion of QVM circuit 301, in accordance with one embodiment of the present invention.
Figure 1G:
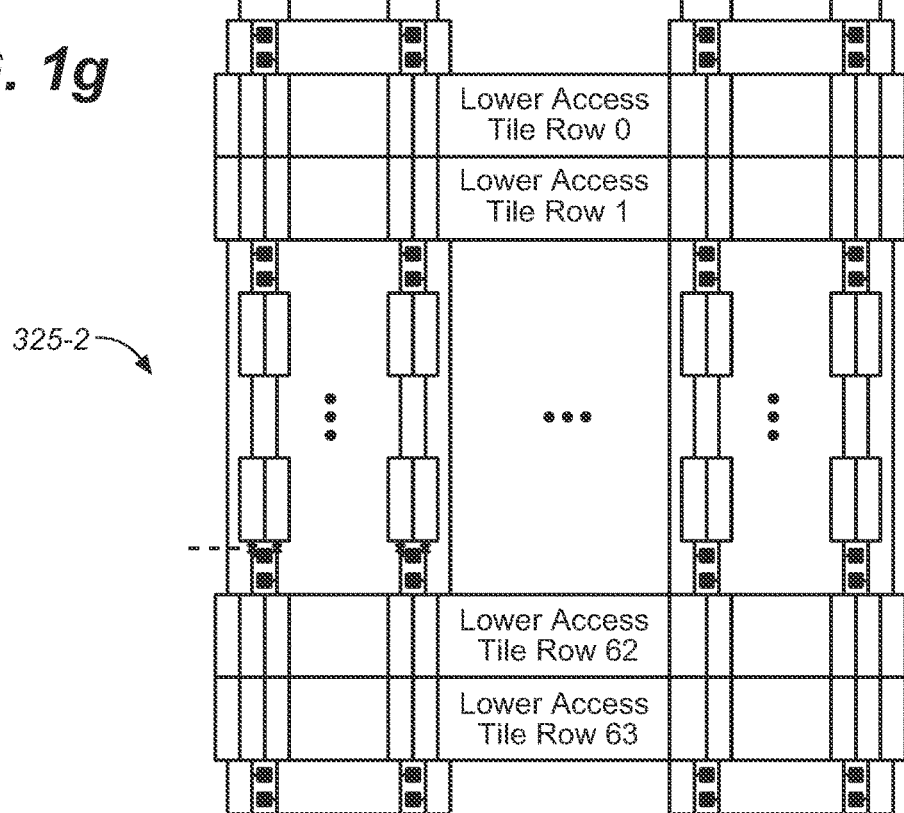

FIG. 1g shows memory circuit 340, which includes cores 325-1 and 325-2 sharing data center 326, suitable for implementing a portion of QVM circuit 301, in accordance with one embodiment of the present invention. In memory circuit 340, each of cores 325-1 and 325-2 may be a 64 rows×32 columns core of tiles, as in the core in memory circuit 320 of FIG. 1c. Data center 326 may be provided similar to data center 323 of FIG. 1c, except that data center 326 is shared between two memory arrays, each of which having 64×32 tiles. In this configuration, an access to a 2K-Byte datum may be delivered at the studs of a row of tiles in 100 nanoseconds or less from each memory array. As cores 325-1 and 325-2 may be accessed simultaneously, 4K-Bytes of data may be delivered every 100 nanoseconds or less. In some embodiments, cores 325-1 and 325-2 of memory circuit 340 form two memory banks.

Figure 1H:
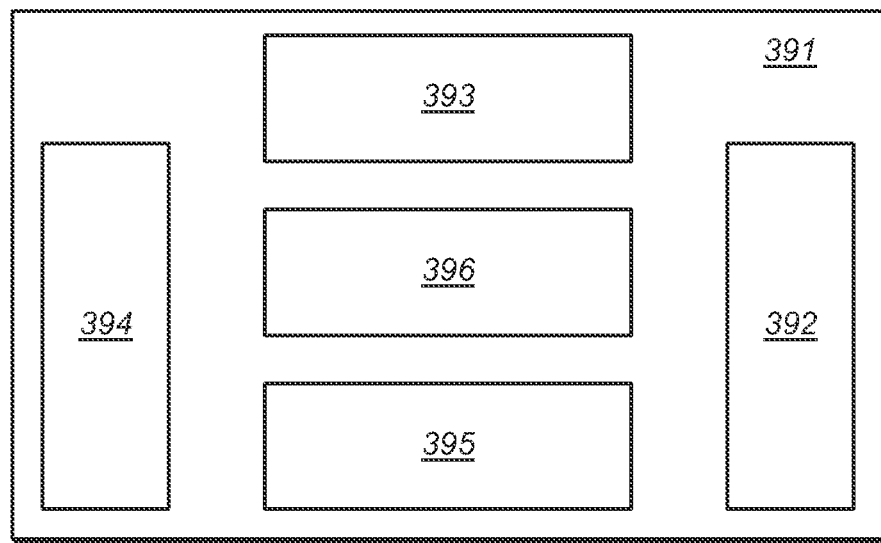
FIG. 1h shows a multi-die configuration implemented using the "flip-chip" technique, in conjunction with a silicon interposer, according to one embodiment of the present invention.

FIG. 1h shows a multi-die configuration implemented using the "flip-chip" technique, in conjunction with a silicon interposer, according to one embodiment of the present invention. As shown in FIG. 1h, multiple semiconductor dies 392, 393, 394, 395 and 396 are each wafer-bonded using, for example, the "flip-chip" technique to silicon interposer 391, which provides a conductor network that interconnects the studs in the semiconductor dies through the studs of silicon interposer 391. (The interconnection network in silicon interposer 391 are connected through its own studs exposed on its surface with studs in the semiconductor dies). In one embodiment, semiconductor die 396 is a memory circuit, while semiconductor dies 392-395 are each a logic circuit (e.g., each including a RISC-type processor). In this configuration, each logic circuit is provided access to a high-bandwidth, high-capacity memory. In another embodiment, semiconductor die 396 is a logic circuit (e.g., including a RISC-type processor), while semiconductor dies 392-395 are each a memory circuit. In this configuration, the logic circuit is provided access to multiple high-bandwidth, high-capacity memory circuits, forming a computing device with a "mega-embedded memory." Of course, semiconductor dies 392-396 may be any combination of memory and logic circuits, as optimized for a specific application. For example, one of semiconductor die 392-396 may be include a memory controller that manages the configuration or configurations of the memory circuits in the other semiconductor dies.

Figure 1I:
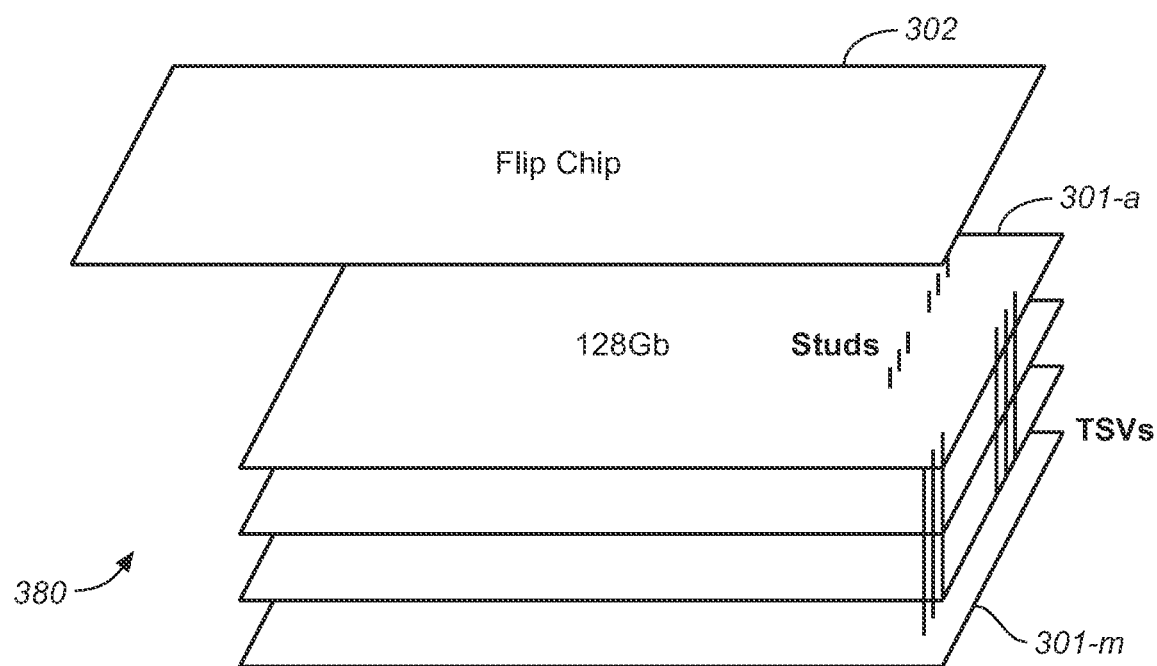
FIG. 1i shows system 380 in which multiple memory circuits 301a to 301-m are wafer-bonded to processor circuit 302 using both the flip-chip and the TSV techniques.

FIG. 1i shows system 380 in which multiple memory circuits 301a to 301-m are wafer-bonded to processor circuit 302 using both the flip-chip and the TSV techniques. In this manner, an even higher capacity embedded memory may be made available to the processor or processors in processor circuit 302. Of course, in the system 380, only the top memory circuit (i.e., memory circuit 301a) may be bonded to processor circuit 302 to enjoy the advantages of high capacity, high bandwidth and fast-access to memory circuit 301a. The other memory circuits 301b to 301m are connected through the TSV technique and accessed over a bus structure.

Figure 7A:
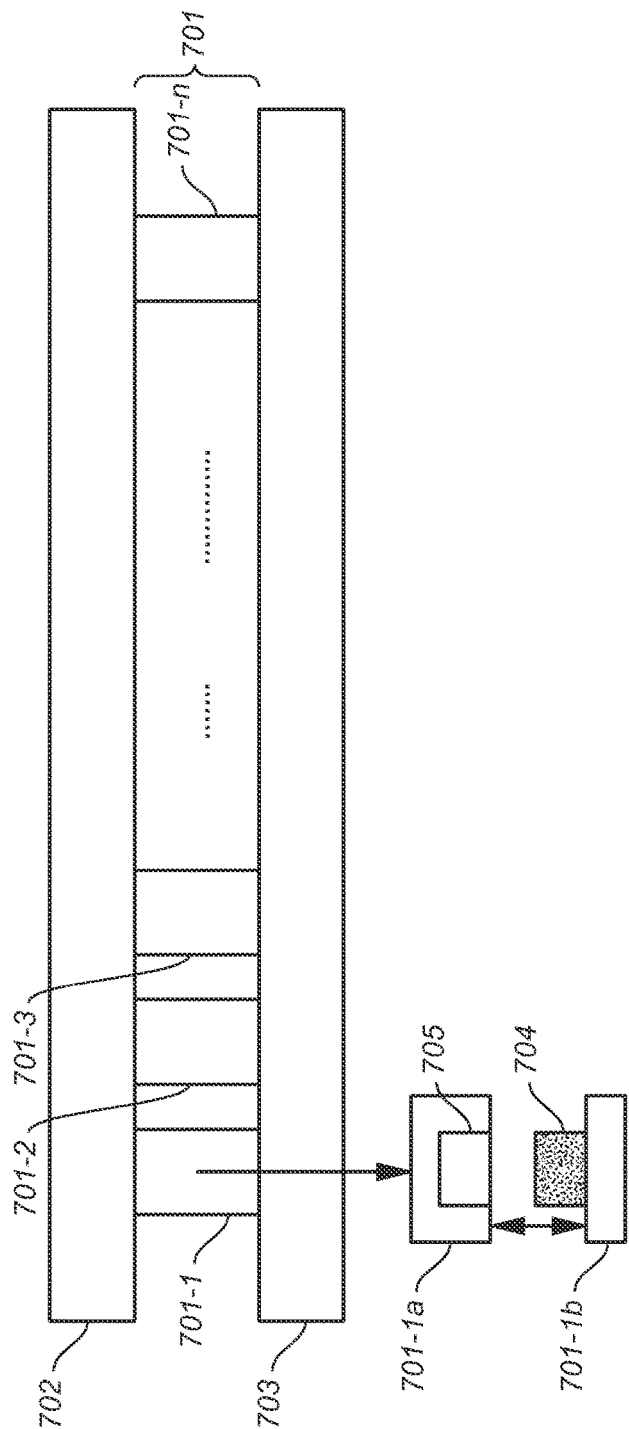
FIG. 7(a) illustrate one manner of providing flip-chip stud connections between two bonded waters.
Figure 7B:
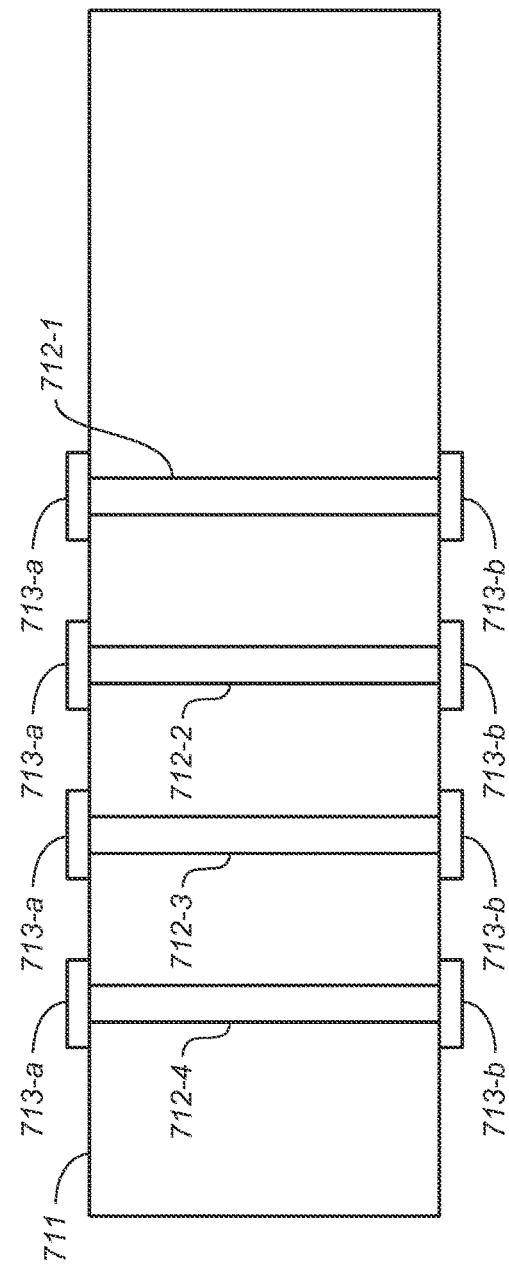
FIG. 7(b) illustrates the TSV technique using a cross section of semiconductor die 711.
Figure 7C:
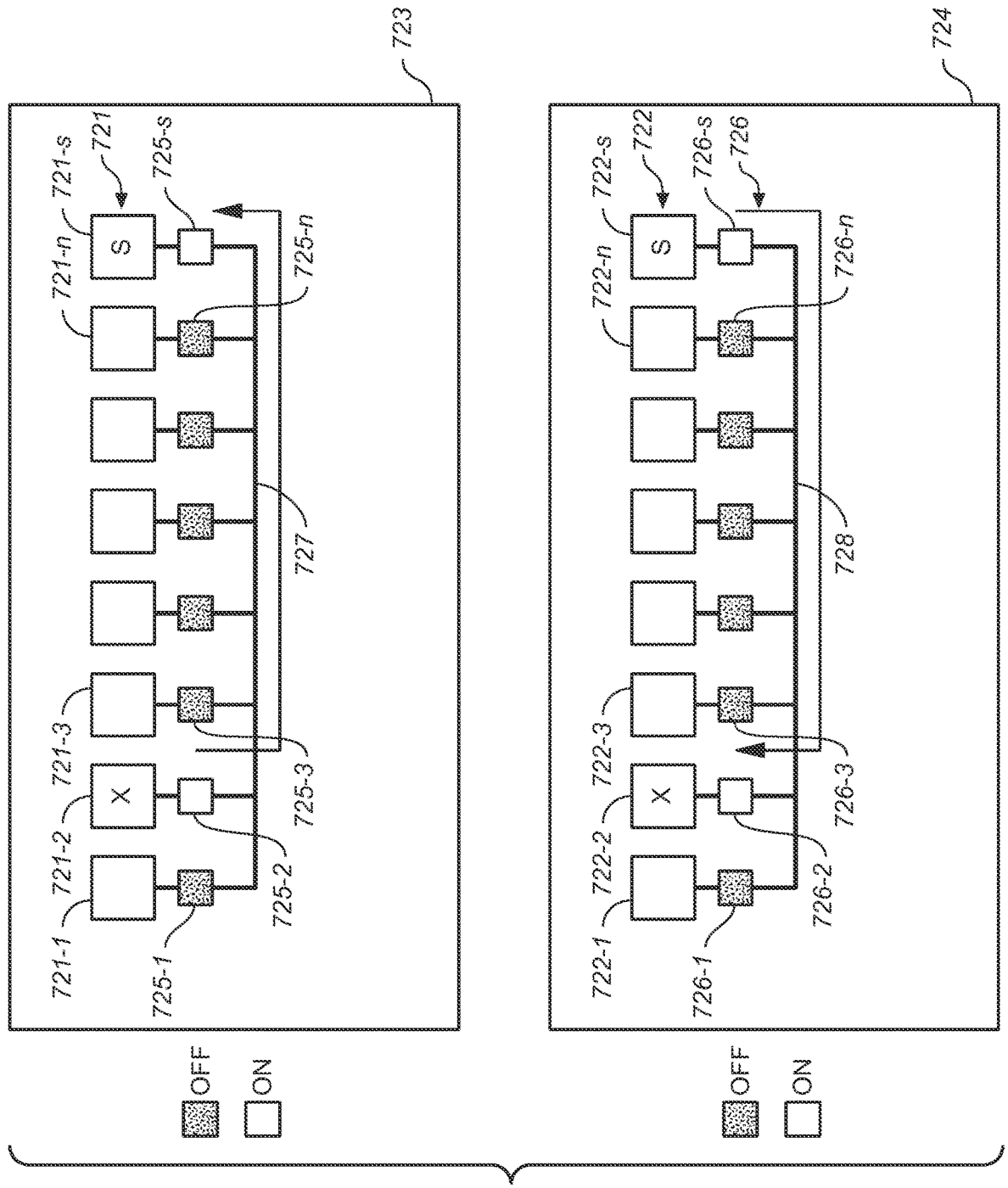
FIG. 7(c) illustrates a routing scheme that allows recovery from a failure in interconnection studs or a TSV.

Whether by interconnection studs or by TSVs, when two semiconductor dies are connected, missed connections for any of various reasons are possible. This type of failures is very costly, as wafer-bonding is performed after circuitry on both the bonded semiconductor dies have been completely fabricated. The present invention provides a routing scheme that allows recovery from such a failure. The routing scheme is illustrated in FIG. 7(c). FIG. 7(c) shows rows 721 and 722 of bonding pads on semiconductor dies 723 and 724, respectively, which are to be wafer-bonded in accordance with the manners described above. In FIG. 7(c), bonding pads in row 721 are labelled 721-1, 721-2, . . . , 721-n. Likewise, bonding pads in row 722 are labelled 722-1, 722-2, . . . , 722-n. In addition, spare bonding pads 721-s and 722-s are provided in row 721 and 722, respectively. Each bonding pad is associated with an interconnection stud or TSV. Bonding pads 721-1 to 721-n and spare bonding pad 721-s are each connected to common conductor ("bus") 727 by a corresponding one of switches 725 (e.g., each a transmission gate, labelled in FIG. 7(c) as transmission gates 725-1, 725-2, . . . , 725-n and 725-s). Likewise, bonding pads 722-1 to 722-n and spare bonding pad 722-s are each connected to common conductor 728 by a corresponding one of switches 726 (e.g., each a transmission gate, labelled in FIG. 7(c) as transmission gates 72g-1, 726-2, . . . , 726-n and 726-s).

If one of the interconnection studs or TSV fails—say, interconnection stud or TSV associated with bonding pad 721-2, for any reason—corresponding transmission gates 725-2 and 725-s and transmission gates 726-2 and 726-s (i.e., their counterparts on semiconductor die 724) are turned conducting to short bonding pads 725-2 and 726-2 to spare bonding pads 725-s and 726-s, respectively. If the interconnection stud or the TSV associated with bonding pads 721-s and 722-s are functioning, they provide an alternative signal path to recover from the failure in the interconnection stud or TSV associated with bonding pad 721-2 or 722-2.

Figure 7D:
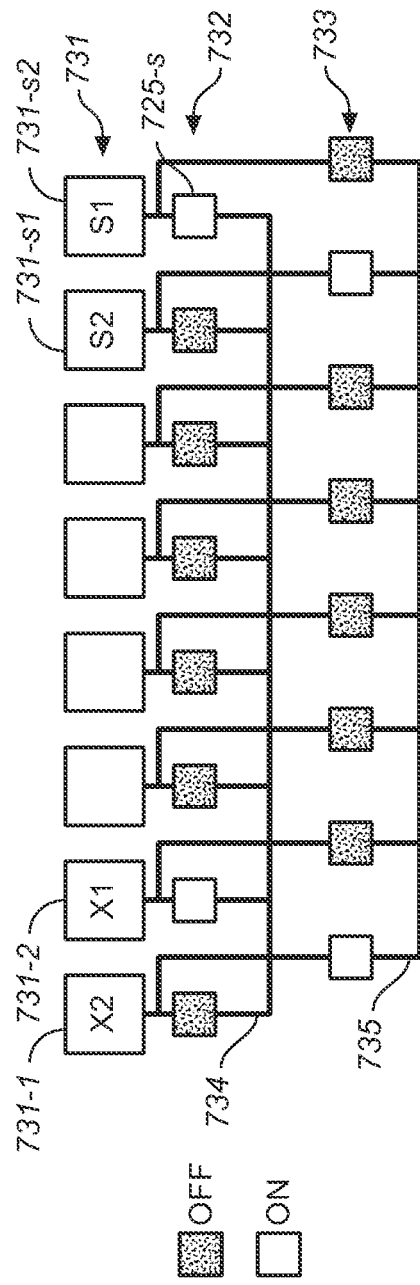
FIG. 7(d) shows an expanded routing scheme from the routing scheme of FIG. 7(c) that provides recovery for any two failures in each row of bonding pads by providing an addition row of transmission gates and an additional common conductor.

The scheme illustrated in FIG. 7(c) allows recovery for a single interconnecting stud or TSV failure in each row of bonding pads. FIG. 7(d) shows an expanded scheme that provides recovery for any two failures in each row of bonding pads by providing an additional row of transmission gates and an additional common conductor. In FIG. 7(d), row 732 of switches and common conductor 732 provide an alternative routing to recover from a single failure associated with any one of the bonding pads in row 731, and additional row 733 of switches 733 and common conductor 735 provide an additional alternative routing to recover from an additional failure associated with an additional one of bonding pads in row 731.

Figure 2:
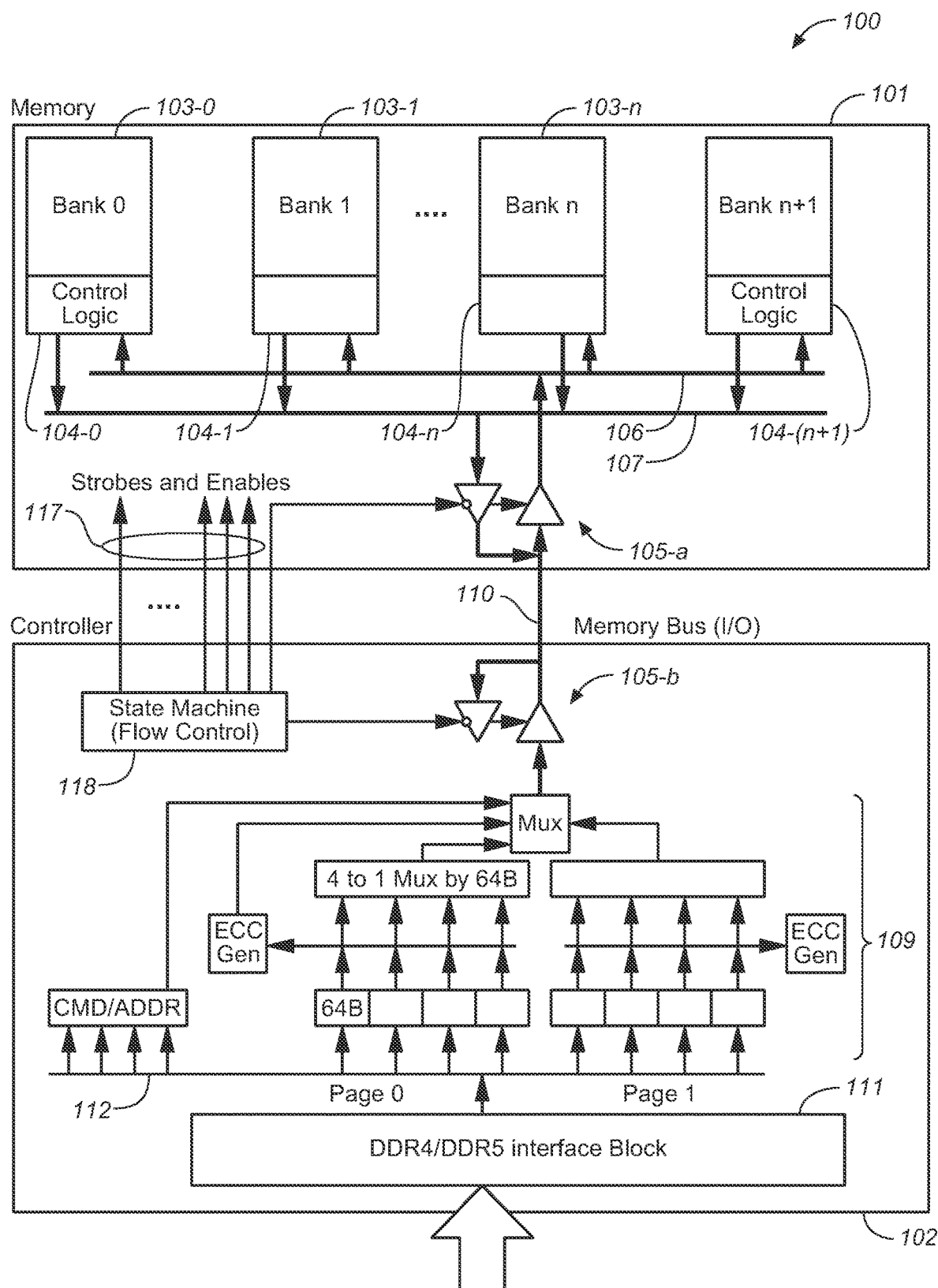
FIG. 2 is a block diagram of memory system 100, which includes memory circuit 101 formed on a semiconductor substrate that is wafer-bonded to controller circuit 102 formed on a second semiconductor substrate, according to one embodiment of the present invention.

FIG. 2 is a block diagram of memory system 100, which includes a memory circuit 101 formed on semiconductor substrate that is joined by wafer-bonding to controller circuit 102 formed on a second semiconductor substrate, according to one embodiment of the present invention. As shown in FIG. 2, memory circuit 101 includes memory arrays organized as memory banks 103-0, 103-1, . . . , 103-n and 103-(n+1). Control logic circuits 104-0, 104-1, . . . , 104-n and 104-(n+1) are associated respectively with memory banks 103-0, 103-1, . . . , 103-n and 103-(n+1) to provide control functions, such as address decoding and timing control for read, write and erase operation sequences. The data read from and to be written into a memory bank resides on internal data buses 106 and 107 respectively. Input/output circuit 105a steers the data from data bus 106 onto memory bus 110 or steers the data from memory bus 110 to data bus 107, as required. Memory bus 110 may be provided by numerous connector studs across the wafer-bond between memory circuit 101 and controller circuit 102. These studs may be formed, for example, by metallic copper. The operations of control logic circuits 104-0, 104-1, . . . , 104-n and 104-(n+1) and input/output circuit 105a are controlled by control signals 117, also driven from state machine 118 in controller circuit 102 over the studs across the wafer bond between memory circuit 102 and controller circuit 102.

In controller circuit 102, input/output circuit 105b operates in a cooperative fashion with input/output circuit 105a in memory circuit 101 to coordinate signal flows across the studs of memory bus 110. In this example, memory bus 110 accommodates 64 data bits per bus cycle. FIG. 2 shows that controller circuit 102 includes state machine 118, data processing circuit ("data center") 109 and external interface 111. External interface 111 may be, for example, a memory bus conforming to an industry standard, such as DDR4, DDR5 and PCIe. For purposes of illustration only, data center 109 includes bus 112—which accommodates two 256-bit pages of data, together with a number of address and command bits—for communication over external interface 111. For data received from external bus 111 to be written into memory circuit 101, data center 109 encodes the incoming data into a number of error-correcting code bits (e.g., 536 bits from 512 bits of incoming data). In FIG. 2, 64 data bits are communicated over memory bus 110 each bus cycle. Other functions not illustrated in FIG. 2 may be carried out in data center 109. For example, data received from memory circuit 101 may be error-corrected according to the retrieved error correction codes, before being sent to a host device over external bus 111.

Figure 3A:
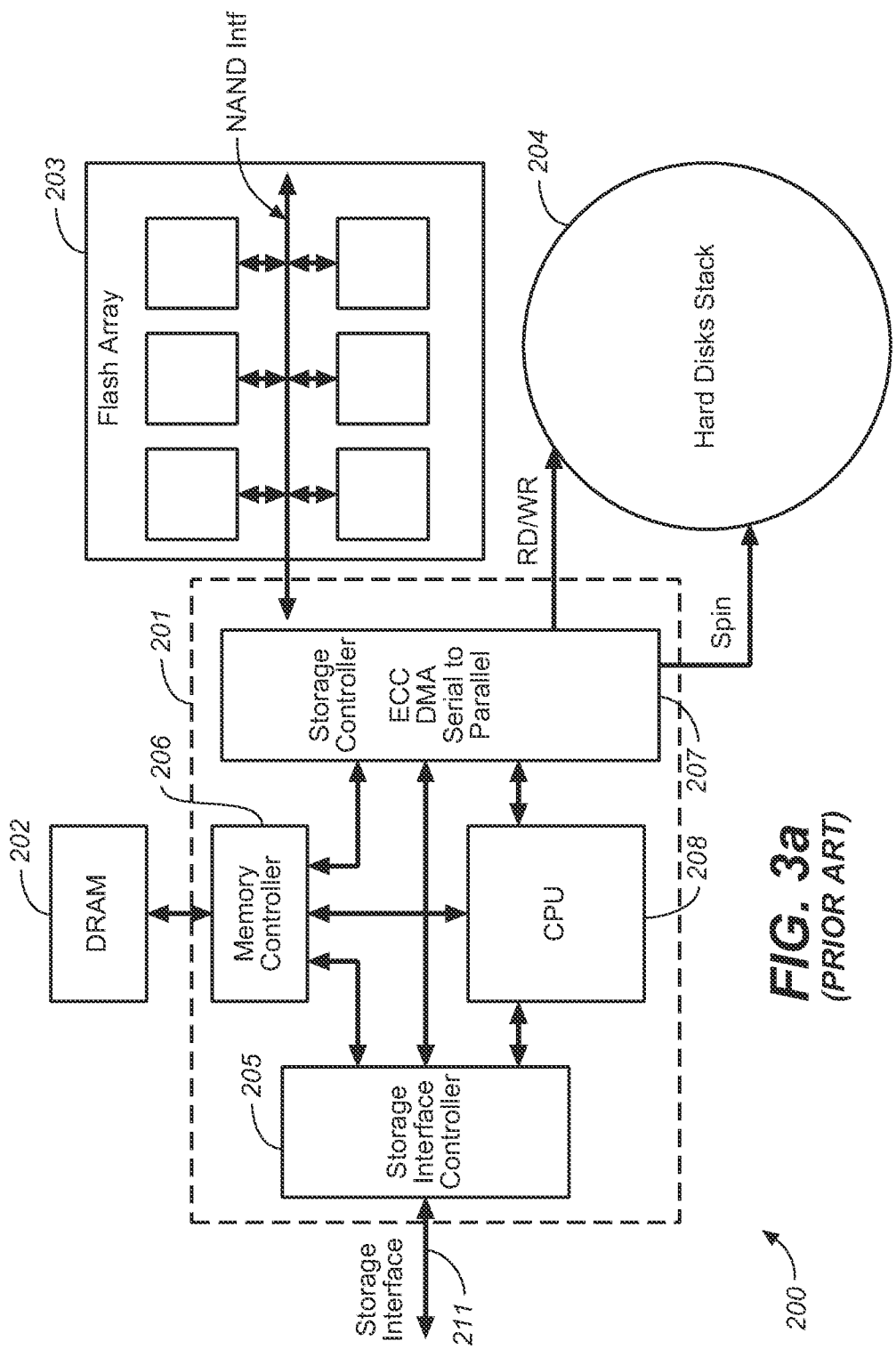
FIG. 3a shows storage system 200 in the prior art for a storage system that includes storage device 204 with flash cache memory 203.

The approach of memory system 100 of FIG. 2 can be extended to other applications, such as a storage system controller. FIG. 3a shows storage system 200 in the prior art for a storage system that includes storage device 204 with flash cache memory 203. As shown in FIG. 3a, storage system 200 includes storage control circuit 201, which controls the operations of storage device 204 with flash cache memory 203. Typically, flash cache memory 203 includes numerous flash memory arrays of NAND memory strings which operations are controlled over a NAND interface by storage controller 207, which also controls storage device 204. Typically, storage control circuit 201 also includes (i) storage interface 205, which interfaces with a host device over storage interface 211 (FIG. 3a), and (ii) memory controller 206, which provides access to a fast run-time memory system, such as dynamic random-access memory (DRAM) 202.

Typically, when data is received over storage interface 211 from the host device ("write data"), or when data is read from either flash cache memory 203 or storage device 204 by storage controller 207 ("read data"), the data is placed in DRAM 202. Central processing unit (CPU) 208's role in managing read and write accesses to storage device 204 and flash cache memory 203 and in maintaining cache concurrency are well-known to those of ordinary skill in the art. In addition, CPU 208 also manages false erase, wear leveling and translation table locator operations, as also known by those of ordinary skill in the art.

Figure 3B:
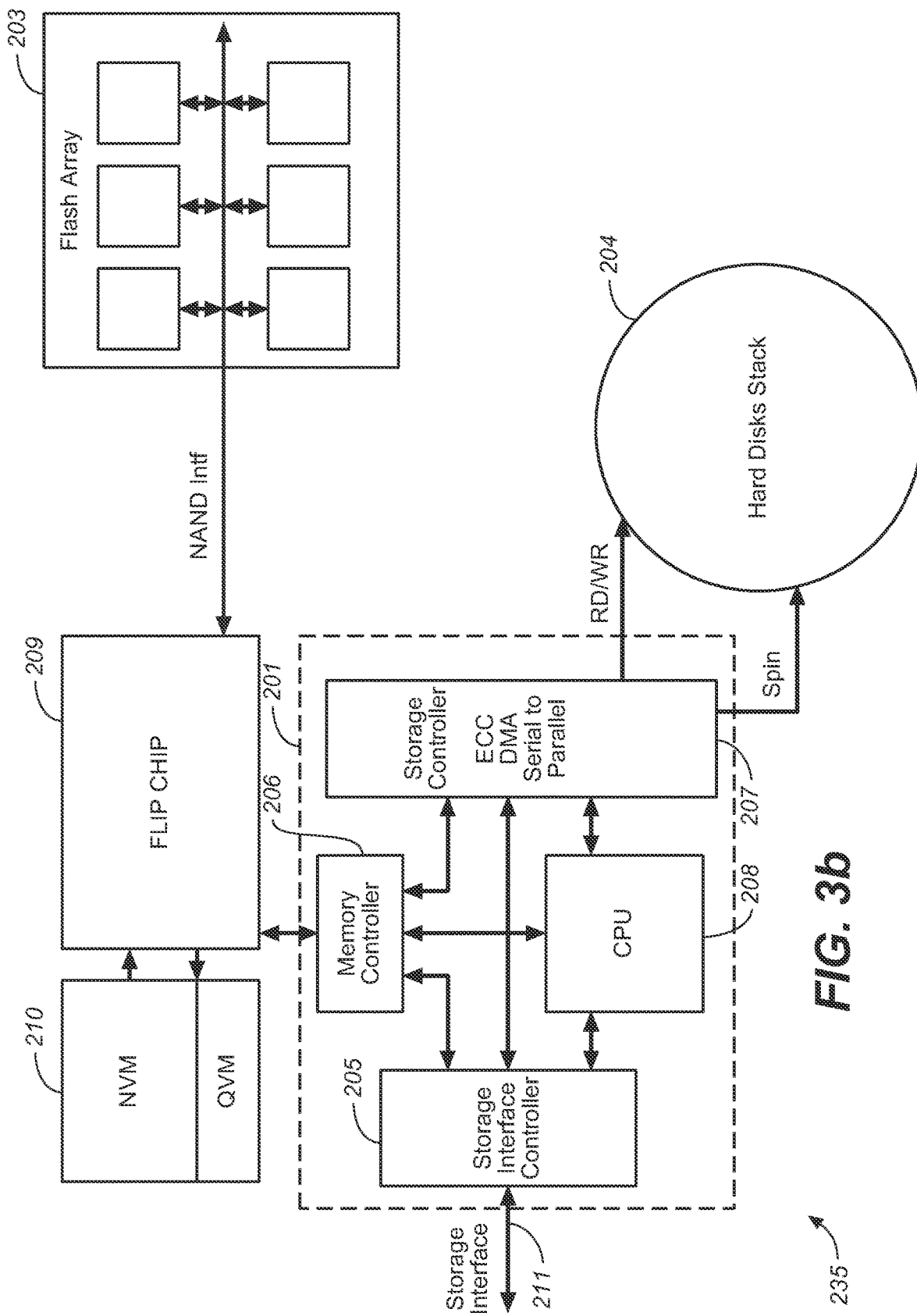
FIG. 3b shows storage system 200 that includes NVM and QVM circuits 210, which are wafer-bonded to multi-interface memory controller circuit 209, according to one embodiment of the present invention.

The high capacity and fast access times of the QVM and NVM of the Non-provisional Applications, as well as the high endurance of the QVM, together with the high bandwidth achievable using wafer-bonding, enable the new applications of the present invention. FIG. 3b shows storage system 200 that includes NVM and QVM circuits 210 that are wafer-bonded with multi-interface controller circuit 209, according to one embodiment of the present invention.

In FIG. 3b, NVM and QVM circuits 210 may be formed on the same semiconductor die or on different semiconductor dies. Wafer-bonding of NVM and QVM circuits 210 to multi-interface controller circuit 209 may be achieved preferably using the flip-chip technique. However, any multi-die configuration using any of TSV, silicon interposer or silicon bridge techniques may also be possible. In storage system 200, NVM and QVM circuits 210 and multi-interface controller circuit 209 replace DRAM 202 of FIG. 2a, as the QVM circuit can offer a higher capacity at a lower cost than DRAM and requires less power. In storage system 200, relative to storage controller 207, multi-interface controller circuit 209 can serve as a NAND controller to manage flash cache memory 203 more effectively, as translation tables, a directory, file allocation tables (FATs) and journaling files may be stored in the NVM circuit or the QVM circuit. Multi-interface controller circuit 209 can access highly efficiently and simultaneously to both NVM and QVM circuits 210 and flash cache memory 203. The higher capacity allows larger translation tables, while fast access to flash cache memory 203 allows more efficient flash management operations (e.g., "erase ahead"), which are not possible in storage system 200 of the prior art. Furthermore, multi-interface controller circuit 209 can monitor flash cache memory 203 for "hot files," which can be moved into the NVM circuit to allow faster accesses and reduce accesses to flash cache memory 203, thereby improving endurance performance. Other functions, such as generating error-correction codes for all the NVM and QVM circuits, as well as for hard-disk system 204, may also be carried out in multi-interface controller circuit 209.

Figure 3C:
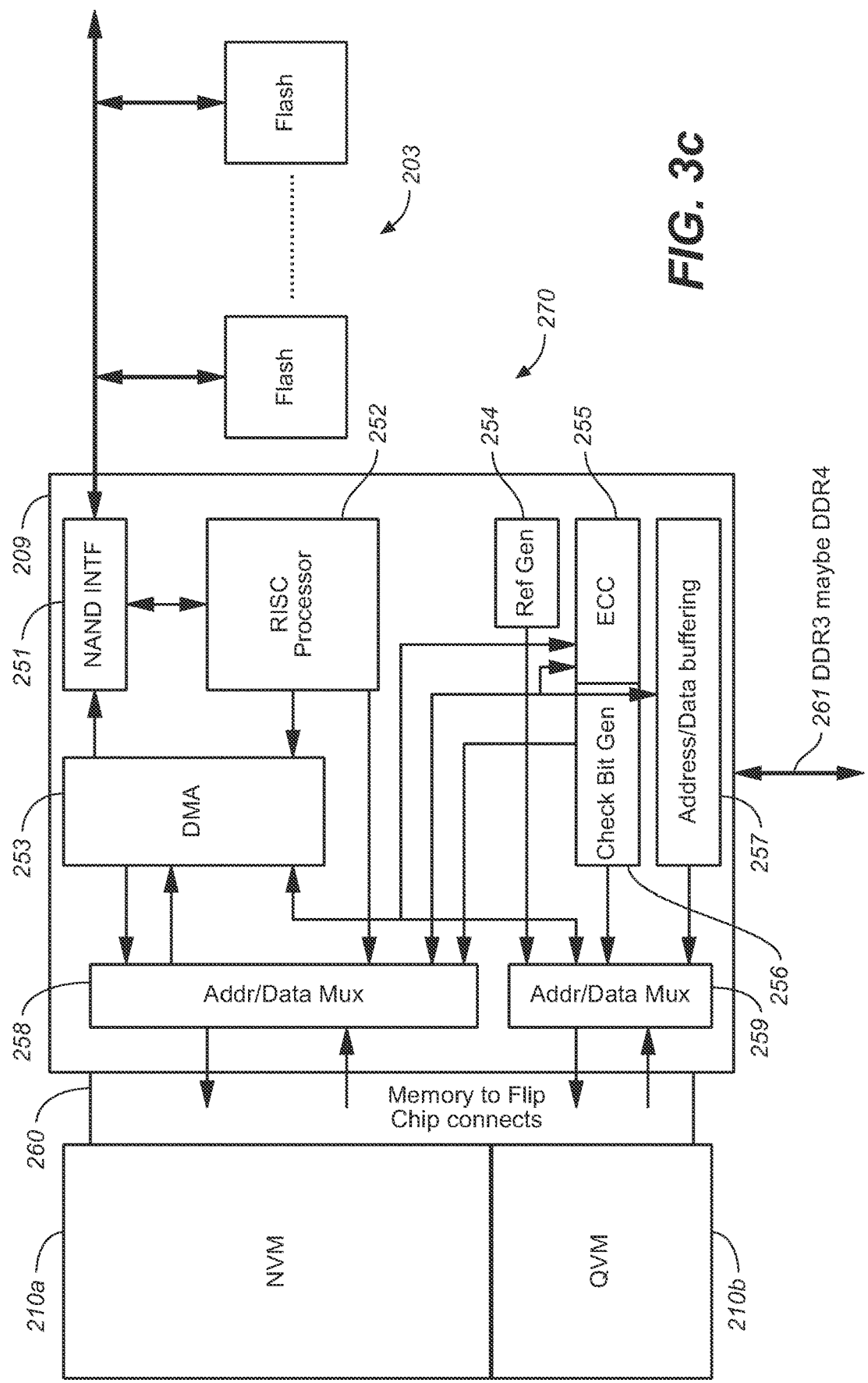
FIG. 3c shows one implementation 270 of NVM and QVM circuits 210 and multi-interface controller circuit 209, according one embodiment of the present invention.

FIG. 3c shows one implementation 270 of NVM and QVM circuits 210 and multi-interface controller circuit 209, according one embodiment of the present invention. As shown in FIG. 3c, multi-interface controller 209 includes NAND interface 251 for controlling flash cache memory 203, DRAM interface 261 (e.g., a data bus conforming to DDR3 or DDR4 standard), and NVM circuit 210a and QVM circuit 210b, corresponding to the NVM and QVM portions of NVM and QVM circuits 210, respectively. In implementation 270, as NVM and QVM circuits 210 are wafer-bonded to multi-interface controller circuit 209, interfaces to NVM circuit 210a and QVM circuit 210b are implemented by the studs provided in the semiconductor dies. One or more reduced instruction set (RISC)-type processors provide operational control of multi-interface controller circuit 209. As shown in FIG. 3c, implementation 270 includes DMA controller 253 for coordinating reading and writing data among NVM circuit 210, QVM circuit 210b and flash cache memory 203. Address and data to be sent or received over DRAM interface 261 may be buffered at address/data buffering circuit 257. In addition, check-bit generation circuit 256 and error-correction code circuit 255 are provided to perform the conventional data integrity functions. Timing signals may be provided from reference generator 254.

RISC-type processor 252 manages the storage controller functions, such as translation tables and cache tables. In addition, multi-interface controller circuit 209 may also participate in managing storage device 204 (see, FIG. 3b). For example, upon receiving a write command over storage interface controller 205 (FIG. 3b) for a write operation to storage system 203, a buffer in QVM circuit 210b is allocated. The write data is loaded into a buffer in QVM 210b, together with check-bits generated from check-bit generation circuit 256. If industry standard FAT format is used, the data is sent to storage system 204 in blocks at designated locations. Flash cache memory 203 and NVM circuit 210a are checked for a cached copy of the file. Such a cached copy is then updated by initiating a parallel write, so as to maintain cache concurrency. An access frequency is maintained for each file to enable wear-leveling and other purposes. A suitable file relocation policy may be implemented.

Similarly, when a read command to storage device 204 is received over storage interface 211, buffer space is allocated in QVM circuit 210b. If a copy of the requested file is present in flash cache memory 203, no access to storage device 204 is initiated. A cache translate table in NVM circuit 210a identifies the location of the file in flash cache memory 203. The requested file is then read into QVM circuit 210b, after error-correction and generation of check-bits, if necessary. If there is not a cached copy, the FAT table entry in NVM circuit 210a for the file is parsed to create a scatter gather-list in one part of the buffer space. Storage controller 207 fetches the data from storage device 204 and provides the read data over DRAM interface 251. Address/data buffering circuit 257 places the data in the buffer space allocated in QVM circuit 210b, after error-correction and together with generated check-bits. Once the data is in QVM circuit 210b, DMA controller 253 coordinate data transfer over storage interface 211 (FIG. 3b).

As mentioned above, QVM circuit 210a may have a data retention time that requires a refresh operation (e.g., every 10 minutes). In one embodiment, QVM circuit 210b is divided into refresh zones. When data is transferred into a refresh zone, an "active bit" is marked in a refresh table for the refresh zone to be refreshed on a periodic basis. When data is transferred out of a refresh zone, its corresponding "active bit" is reset, which halts refresh operation in that refresh zone. This refresh scheme is particularly advantageous in many applications, such as those that use the QVM circuit as temporary or transitory storage for read or write operations from or to a disk system or an NVM storage device and for receiving or passing data to a server DRAM. When the temporary or transitory operation is completed, no refresh to allocated space in that portion of memory is necessary. Furthermore, in very active usage (e.g., when files are moved quickly), such that no data of the transitory operation stay in the QVM memory for a greater period than the refresh interval, no refresh is required. In data flow applications, only a very small number of refreshes is likely triggered, which results in low power operation and higher performance.

Other embodiments of the present invention are applicable to field-programmable logic devices, such as field-programmable gate arrays (FPGAs). In this description, while FGPAs are used as examples for illustrative purposes, it is understood that the same principles are applicable to virtually all field-programmable logic devices. FPGAs are typically fabricated under a logic process, which is usually incompatible for forming on the same semiconductor substrate large capacity or high-performance memory circuits. Therefore, FPGA designs typically include neither non-volatile memory nor DRAM memory circuitry. Memory resources on an FPGA circuit are typically provided by fast static random-access memory (SRAM). As SRAM circuits are volatile, an FPGA circuit must be configured upon power-up from an external circuit, typically from a non-volatile memory circuit. The bandwidth for transferring data for configuration of an FPGA circuit, often provided over a serial interface, is the bottle-neck that creates a lengthy latency to the FPGA circuit becoming functional during a power-on reset.

FGPA circuits often include other application-specific custom logic circuits on the same semiconductor die, such as industry standard data interfaces (e.g., PCIe, DDR3/4 and other interfaces), ethernet cells, processor cores and neural networks.

Figure 4A:
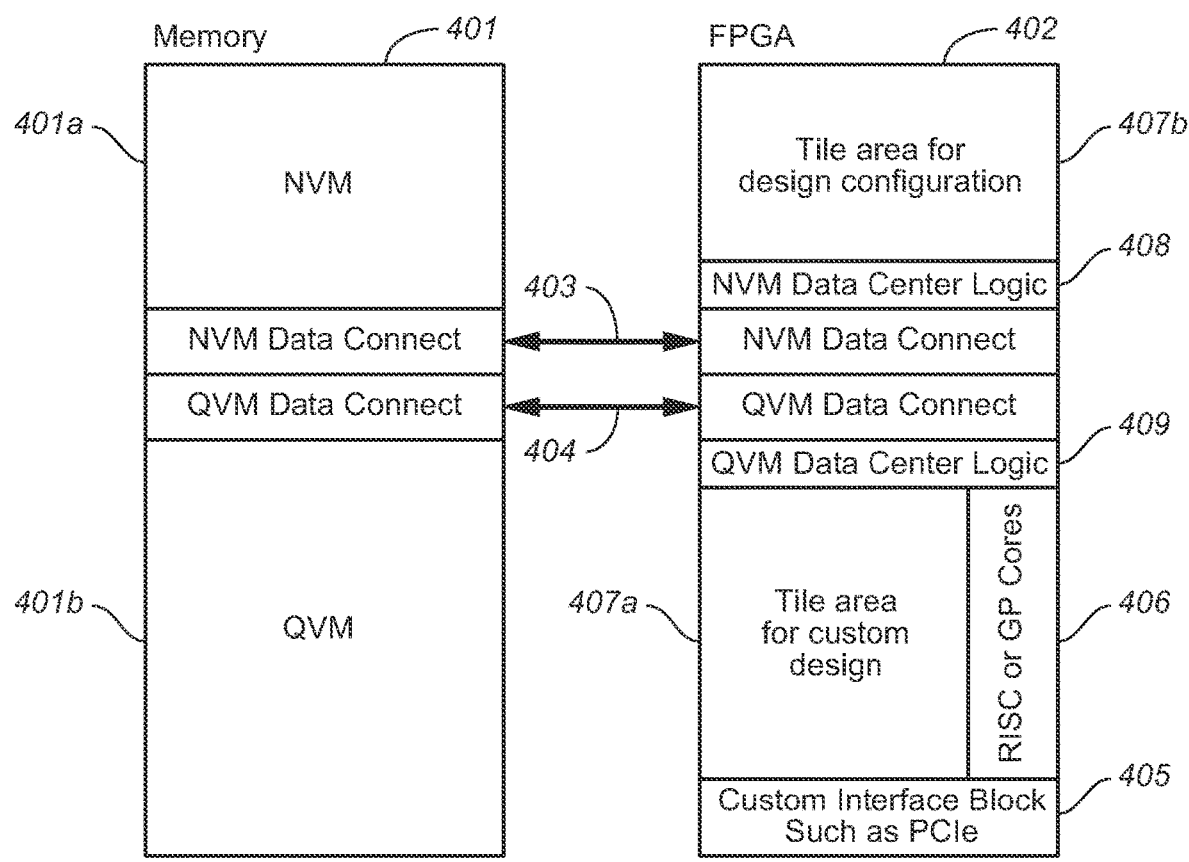
FIG. 4a shows system 400, in which high-capacity memory circuit 401 is wafer-bonded using the flip-chip technique to FGPA circuit 402, according to one embodiment of the present invention.

One long-felt need for designers using FPGA circuits is the availability of a high-capacity, high bandwidth memory. The present invention addresses this long-felt need by wafer-bonding a high-capacity memory circuit (e.g., those described in the Non-provisional applications) with an FPGA circuit, taking advantage the high-bandwidth, low-power data transfer over the studs. FIG. 4a shows system 400, in which high-capacity memory circuit 401 is wafer-bonded using the flip-chip technique to FGPA circuit 402, according to one embodiment of the present invention.

In memory circuit 401, portion 401a implements NVM circuits, while portion 401b implements QVM circuits. While FIG. 4a shows memory circuit 401 as including both QVM and NVM circuitry, other embodiments may have QVM and NVM circuitry provided separately on separate semiconductor dies, wafer-bonded using, for example, any TSV, silicon interposer or silicon bridge techniques, or a combination of these techniques. In system 400, data from NVM portion 401a and QVM portion 401b are communicated over data buses 403 and 404—implemented by wafer-bonded studs—to FPGA circuit 402. The data transfers over data buses 403 and 404 are controlled by NVM data center 408 and QVM data center 409 that are implemented on FPGA circuit 402. FPGA circuit 402 includes programmable logic circuitry 407a and corresponding configuration circuitry 407b, and custom logics 405 and 406. For example, custom logic circuit 405 may be an industry standard data interface (e.g., PCIe), while custom logic circuit 406 may be one or more RISC-type or graphics-type processor cores, or arithmetic-logic units (ALUs).

Providing data centers 408 and 409 on FPGA circuit 402 allows a flexibility that is advantageous in many configurations and applications. For example, FPGA circuit 402 may be configured to implement numerous functions that may have memory requirements or have usage patterns that are independent of each other. This application may be satisfied, for example, by configuring the memory in memory circuit 401 into dual-ported segments that can allow read and write-back operations in each segment independently of other segments. Allowing the memory circuit 401 to be configured in flexible ways from FPGA circuit 402 enable efficiency or make possible many applications. For example, segmented processing provides advantages for applications such as neural networks. Also, rather than moving large amount of data ("data sets") required for calculations, the data sets may be stored in different data segments and swapped for processing to take advantage of the quick context switching. Furthermore, the memory segments can be configured into one or more first-in-first out (FIFO) segments suitable for pipelined applications.

(Note that, although FIG. 4a uses as an example an FPGA circuit, the principles described herein for FPGA circuit 402 is applicable to other applications, such as a dedicated controller connected to memory circuit 401 in this manner).

Figure 4B:
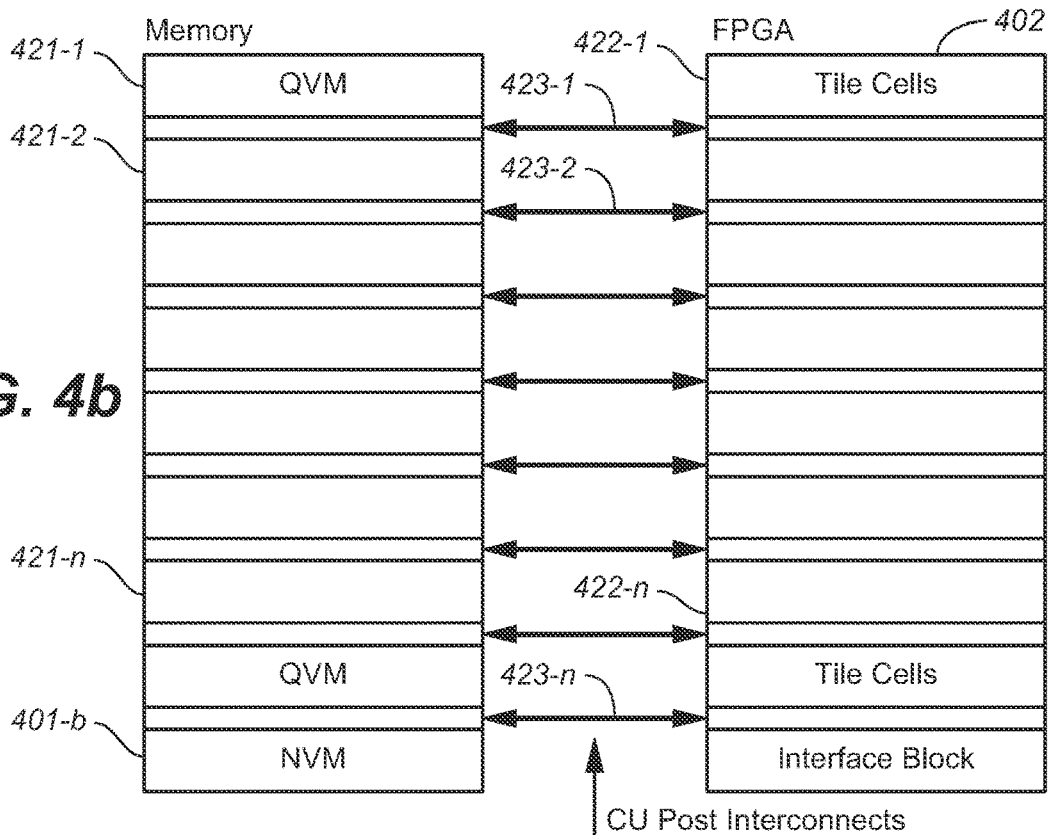
FIG. 4b is a logical representation of a configuration in which QVM portion 401b of memory circuit 401 is segmented into memory segments 421-1, 421-2, . . . , and 421-n, respectively serving programmable logic ("tile cells") segments 422-1, 422-2, . . . , and 422-n over data buses 423-1, 423-2, . . . , and 423-n.

FIG. 4b is a logical representation of a configuration in which QVM portion 401b of memory circuit 401 is segmented into memory segments 421-1, 421-2, . . . , and 421-n, respectively serving corresponding segments of programmable logic ("tile cells") 422-1, 422-2, . . . , and 422-n over data buses 423-1, 423-2, . . . , and 423-n. In FIG. 4b, data buses 423-1, 423-2, . . . , and 423-n are each provided by the studs in the wafer-bond between memory circuit 401 and FGPA circuit 402. QVM portion 401b may be of modular design, such that adjacent segments may be combined to form larger segments for applications requiring additional memory resources. The segmented approach obviates the need for data transfer using complex circuitry (e.g., DMA or data connect center) that requires allocation of buffer memory and other circuitry that may incur substantial delay. QVM (or NVM) memory 421-1 to 421-n may be segmented, according to one embodiment of the presentation, in part by providing dedicated control and sensing logic circuitry associated with each memory segment, thus making each memory segment semi-autonomous. Such control and sensing circuitry is most efficient when implemented either below or above the memory layers of the segment. Under the segmented approach, the bandwidth available to studs allocated to a memory segment is dedicated to the segment alone and no buffering is required. The segmented design provides great advantage in applications, such as neural networks, in which large number processors operating simultaneously have need for frequently fetching and writing back data. Segmentation may be configured using a configuration scheme similar to that shown in FIG. 1f, for example.

The segmented approach which allows multiple parallel electrical connections between the logic device and the memory device, provides for many memory usage schemes not previously possible. For example, by partitioning the memory into smaller blocks that are logically concatenated, a user may use the memory as a dual ported device. In that usage scheme, when writing an amount of data spanning two or more small blocks, after the first small block is written and while the system is writing the remainder of the data to the next small block, the first block is available for reading. The segmented approach allows a reading operation to initiate before all the data is written. Allowing initiation of reading to overlap with the write operation on the rest of the data block being transferred saves time. In some DMA operations, this ability results in very high burst rates. In the prior art, in large transfers (e.g., 10 GB), some systems use SRAM for bursting, or wait for the transfer to complete before starting high speed transfer out of the space. A burst capability can save cost and support high speed packet transfers before one side of a transfer is complete.

Figure 4C:
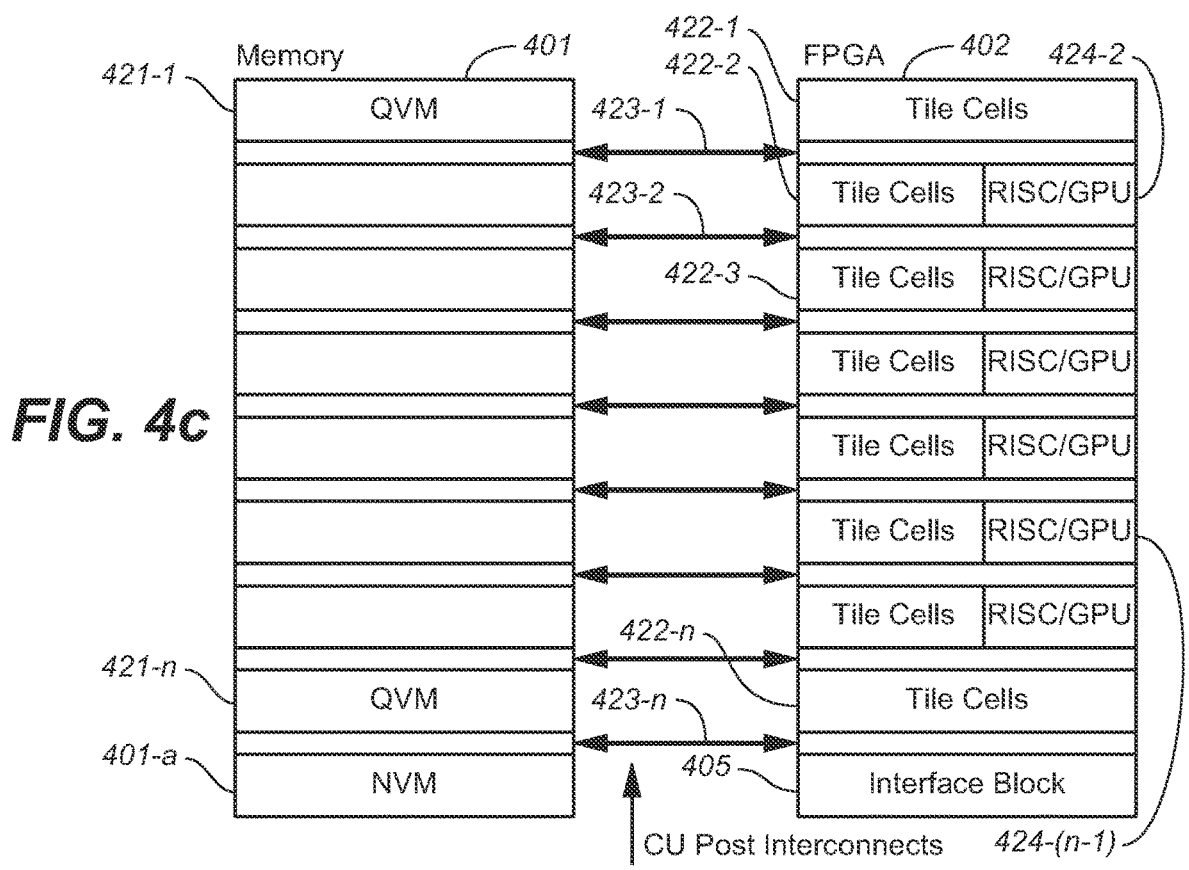
FIG. 4c a logical representation of a variation of the configuration of FIG. 4b, in which tile cell segments 422-1, 422-2, . . . , and 422-n is also paired with custom logic circuits.
Figure 4D:
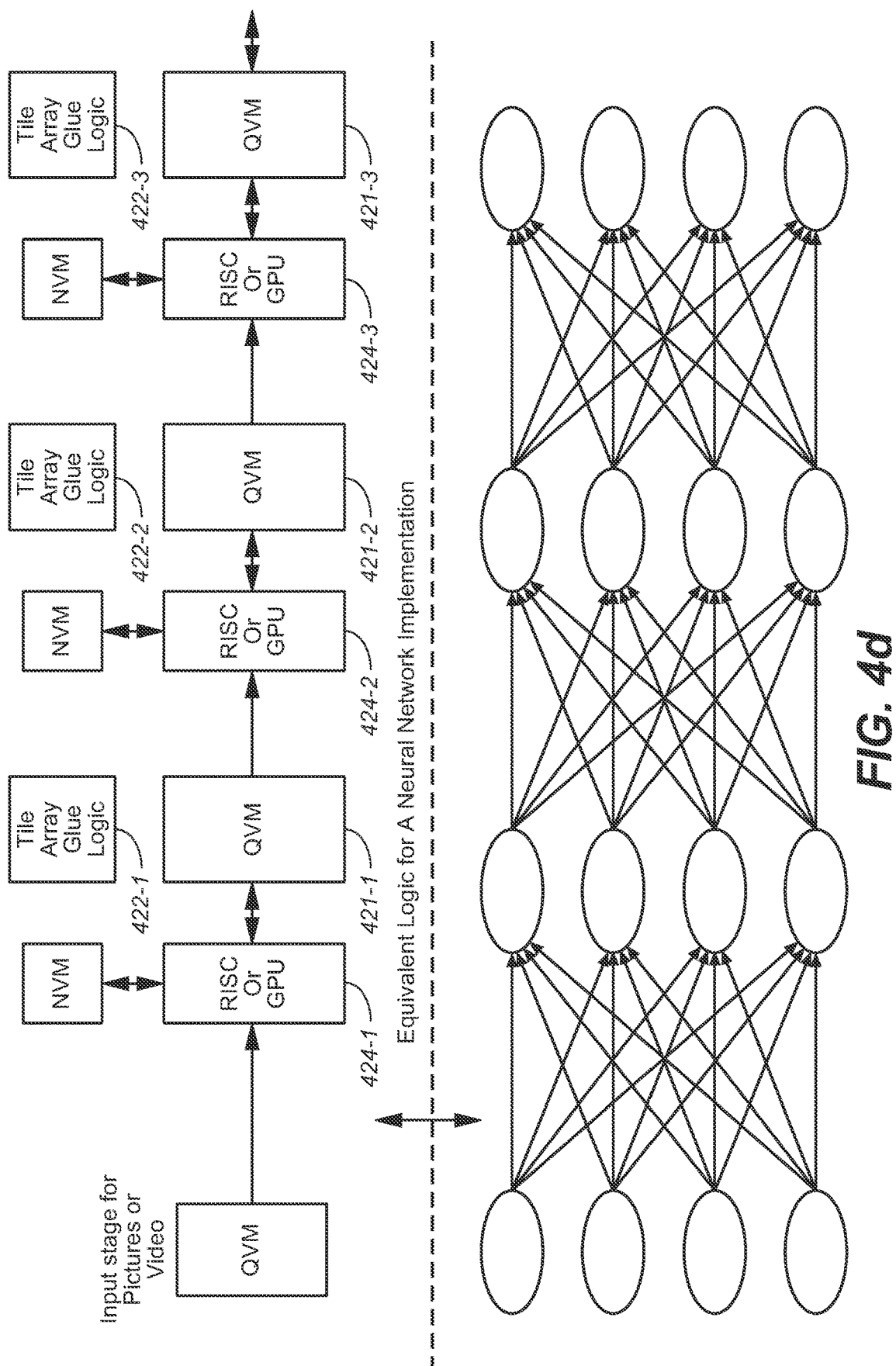
FIG. 4d illustrates a neural network application implemented by the configuration of FIG. 4c, in which each memory segment and its associated tile cell segment and custom logic implement a stage of a neural network, in accordance with one embodiment of the present invention.

FIG. 4c a logical representation of a variation of the configuration of FIG. 4b, in which tile cell segments 422-1, 422-2, . . . , and 422-n are also paired with custom logic circuits. In FIG. 4c, custom logic circuits 424-2, 423-3, . . . , and 424-(n-1) are seen operating with tile cell segments 422-2, . . . , and 422-(n-1). Such custom logic circuits may include, for example, a RISC-type processor a graphics processing unit. In some embodiment, one of the memory segments may be used as a code store for the custom logic circuit processor. The approach of partitioning memory circuit 401 into memory segments can optimize many applications. For example, FIG. 4d illustrates a neural network application implemented by the configuration of FIG. 4c, in which each memory segment and its associated programmable logic tile cell segment, together with its custom logic, implement a stage in a neural network, in accordance with one embodiment of the present invention.

Under the present invention, both processor-based device (e.g., the electronic device of FIG. 3a) and the FGPA-based device (e.g., the electronic device of FIG. 4a) have great advantage for implementing applications that are both computation and memory centric. The segmented approach allows parallel operations using multiple processors (e.g., RISC-cores) with high-bandwidth access to a high capacity memory. Alternatively, the memory segments can be configured as stages of a pipeline for simultaneous processing by multiple processors each optimized for a specific stage, as illustrated in FIG. 4d. Because of the high bandwidth to the memory accessible by the processing units, very high throughput can be expected as interim results for each stage of the computation are made available to the next stage without delay resulting from the memory bandwidth limitation.

The flip-chip wafer-bonded combinations of memory and FPGA circuits, as provided by the present invention, has the advantage a fast power-on, as the FPGA circuit can be quickly configured at power-on over the high-bandwidth interface from NVM portion 401a of memory chip 401. The high-bandwidth interface allows configuration bits to be set in parallel for a fast configuration to allow the configured programmable logic to be ready shortly after power-on. In some embodiments, a part of the configuration logic may be subsequently configured for functional operation. Having an NVM portion in memory 401 also enables dynamic configuration at run-time, which is a difficult, if not impossible, operation in the prior art.

Figure 5A:
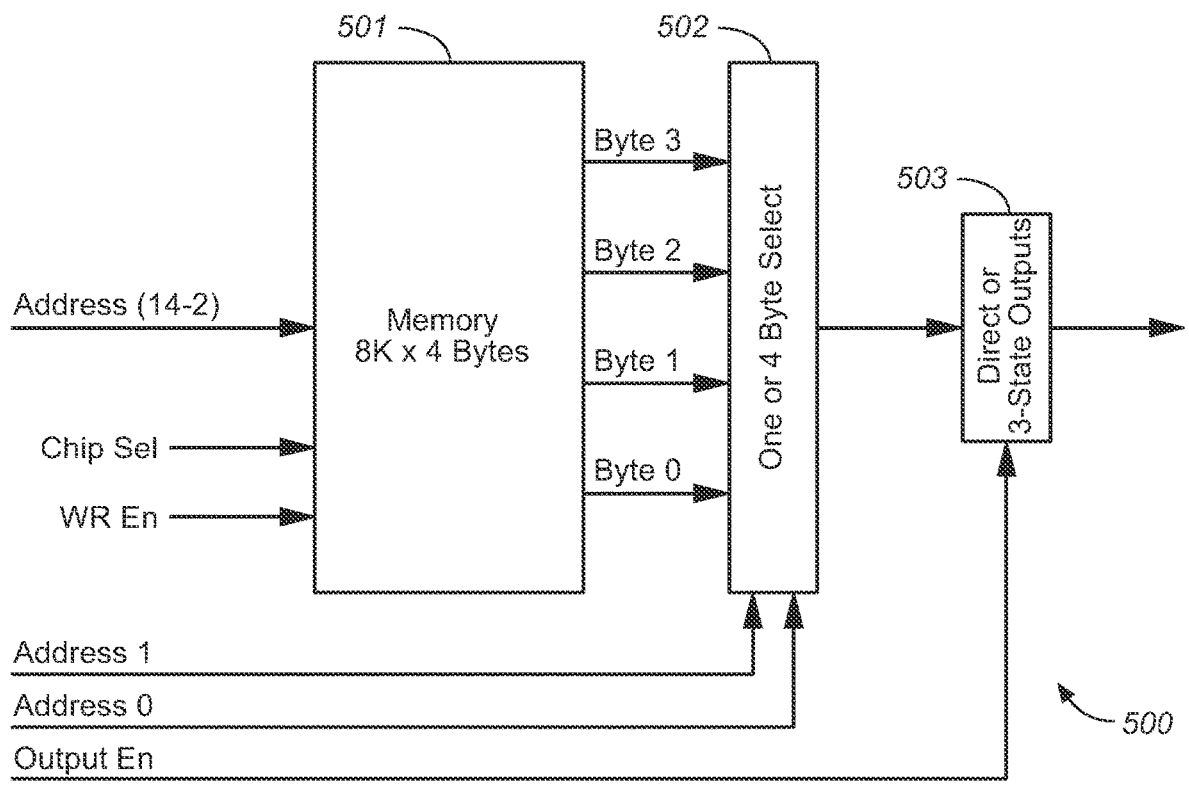
FIG. 5a shows programmable logic tile cell 500 implemented in 8K×4 byte memory array 501, which can provide an 8-bit output datum directly to an embedded processor or similar logic circuit.

A field-programming logic device (e.g., an FPGA) may be implemented as a look-up table in a memory circuit. In that implementation, the data input is used an address to the memory circuit and the logic function corresponding to the data input is stored at the addressed location. Thus, the programmable logic (e.g., the tile cells of FIG. 4c), for example, may be implemented memory circuit (e.g., memory circuit 401 of FIG. 4a), with its output provided over the studs between the memory circuit and a wafer-bonded logic circuit for processing. FIG. 5a shows programmable logic tile cell 500 implemented in 8K×4-byte memory array 501, which can provide an 8-bit output datum directly to an embedded 8-bit processor or a similar logic circuit. In this example, the 8-bit output datum is selected in multiplexer 502 by the address bits and output by 3-state driver 503 (or direct drive).

Figure 5B:
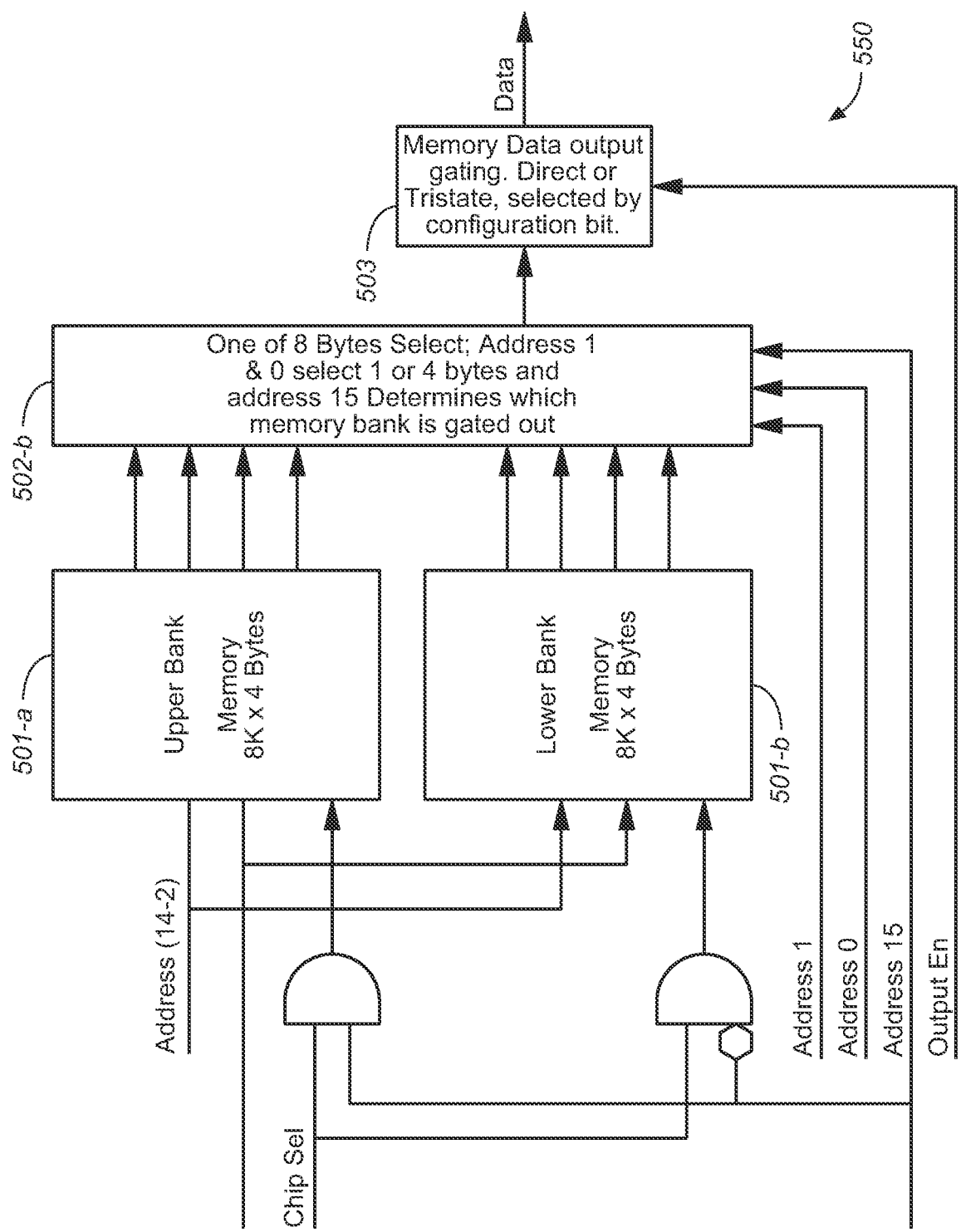
FIG. 5b shows programmable logic tile cells 501a and 501b in a memory circuit configured to provide to make a 16K×4-byte memory array.

With a suitable modular design, multiple programmable logic tile cells can be configured to form a larger programmable logic circuit. For example, FIG. 5b shows programmable logic tile cells 501a and 501b in a memory circuit configured to provide to make a 16K×4-byte memory array.

To implement programmable logic in memory, configurable logic must be provided to allow configuration of the input signals, the output signals and the address signals. Such configurable logic may be implemented by transmission gates programmed by configuration cells.

Figure 5C:
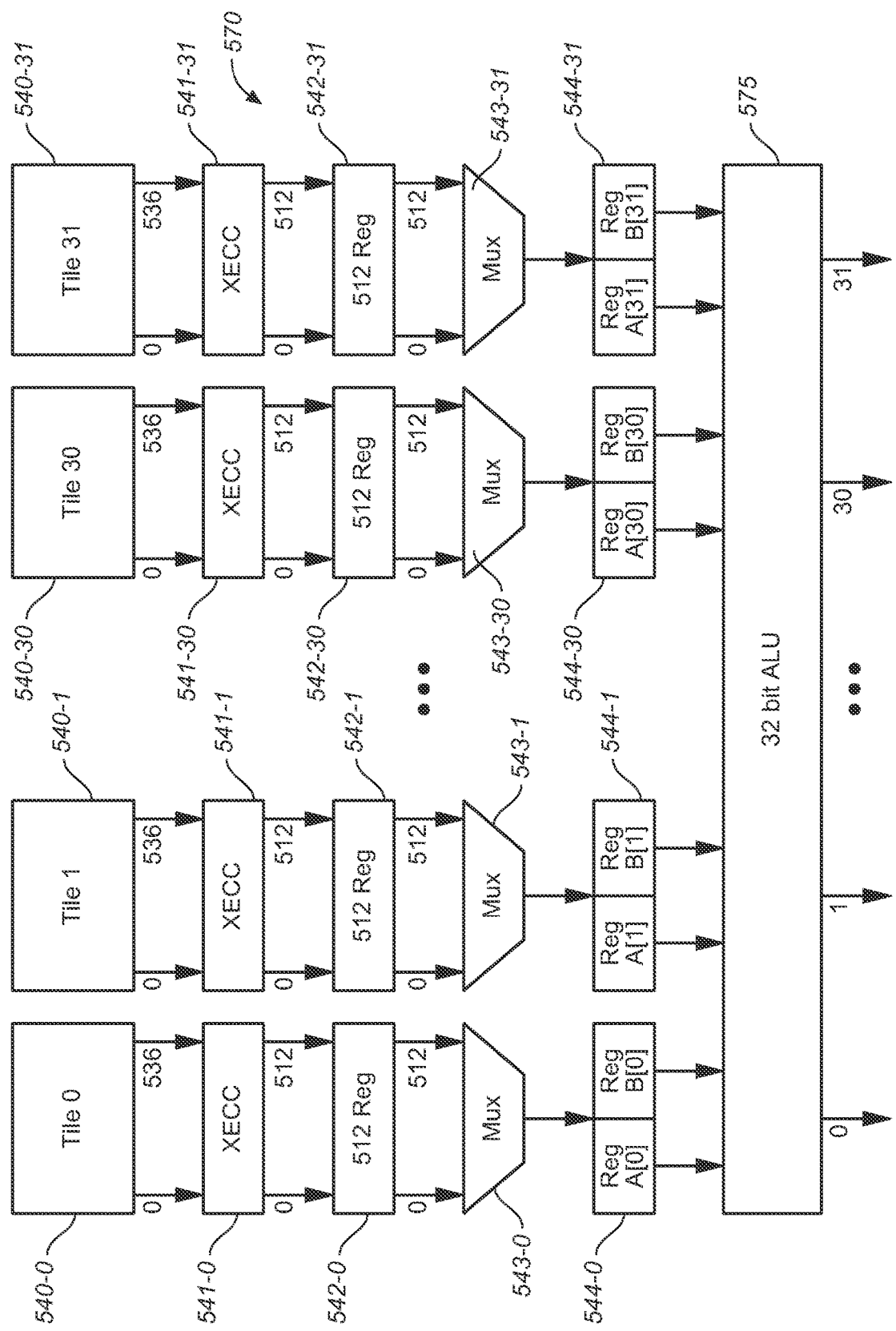
FIG. 5c shows modular memory segment 570 that has associated ALU 575 for arithmetic and logic operations, in accordance with one embodiment of the present invention.

In some instances, it may be advantageous to allow arithmetic and logic operations in a modular memory segment, which may be useful in many applications. ALUs are known to those of ordinary skill in the art. Alternatively, arithmetic operations can often be carried out using a multiply-accumulate unit (MAC). MACs are also known to those of ordinary skill in the art. FIG. 5c shows modular memory segment 570 that has associated ALU 575 for arithmetic and logic operations, in accordance with one embodiment of the present invention. As shown in FIG. 5c, memory segment 570 includes memory tiles 540-0 to 540-31, each containing 536 error-correction coded bits, similar to those described above, such as memory tile 324-0-0 of FIG. 1c. The 536-bit output of each tile is processed at a corresponding one of error correction modules 541-0 to 541-31 to provide a 512-bit error-corrected datum, which may be latched into a corresponding one of 512-bit register 542-0 to 524-31. Any of the data bits in 512-bit registers 542-0 to 542-31 may be selected by a corresponding one of 512:1-multiplexers 543-0 to 543-31 into a corresponding bit in one of the two input registers A and B of 32-bit ALU 545. Error-correction modules 541-0 to 541-31, 512-bit registers 542-0 to 542-31, 512:1-multiplexers 543-0 to 543-31, registers A and B and ALU 545 may all be placed in one of the data centers of the memory circuit, for example.

The QVM circuits of the Non-provisional Applications may be formed out of various deposited materials over a silicon substrate. In some embodiments, the 3-dimensional memory arrays of the QVM circuits, even with multiple layers of memory cells (e.g., 8, 16 or 32), are generally less than a few microns thick. According to one embodiment of the present invention, conductors may be provided in vias that run the entire thickness of the memory array ("through vias"). With its silicon substrate removed, the QVM circuit may be wafer-bonded on both of the opposite sides to two other circuits. In such a configuration, the conductors in the through vias may be used to connect these wafer-bonded other circuits. Unlike conventional TSVs—which are typically hundreds of microns thick—the through vias of the present invention are merely a few microns thick, thus they are easier to fabricate relative to TSVs and with a much lower resistance. FIGS. 6a-6d illustrate the use of through vias in a QVM circuit that is wafer-bonded with two other circuits in accordance with one embodiment of the present invention.

FIG. 6a shows a cross section of QVM circuit 601 and logic circuit 602 (e.g., a memory controller circuit). Logic circuit 602 may include, for example, registers, buffer circuits, and memory operation support circuitry 639 for programming, erasing and reading the memory arrays of QVM 601 formed in or on silicon substrate 638. In addition, memory operation support circuitry 639 may also include power supply circuitry. QVM circuit 601 may include QVM memory array structure 617 formed above silicon substrate 618. In FIG. 6a, hybrid bonding pads 634 and 631 are provided at the surface of logic circuit 602 for electrical access to memory operation support circuitry 639 formed at or on silicon substrate 638. Memory array structure 617 is generally embedded in silicon oxide. Although shown in FIG. 6a, merely for illustrative purpose only, as having only two layers of memory cells, QVM memory array structure 617 may include any number of memory cell layers.

In FIG. 6a, memory array structure 617 includes memory cells portion 616 and "staircase" portion 620. Memory cells portion 616 may include, for example, NOR memory strings. The common bit line and the common source line of each NOR memory string may be electrically accessed from staircase portion 616. (In some embodiments, as disclosed in the Non-provisional Applications, the common source lines need not be externally accessed.) FIG. 6a shows the bit and source lines are connected, in staircase portion 620, by vias to interconnect layers 614, which are connected by vias to "hybrid" bonding pads 611 at the top surface of QVM circuit 601. Interconnect layers 614 are sometimes provided as "redistribution layers," as known to those of ordinary skill in the art. Local word lines to the NOR memory strings are provided vertically in memory cells portion 616 and routed through two or more layers of interconnect conductors ("global word lines") provided below and above memory array structure 617. The global word lines are also connected by vias to hybrid bonding pads 611 at the surface of QVM circuit 601. Hybrid bonding pads 611 are also provided for routing power and ground supply voltage lines. FIG. 6a also shows QVM 601 includes conductor-filled through vias 613 that substantially run the entire thickness of memory array structure 617. Hybrid bonding pads 610 are provided at the top surface of QVM circuit 601 to access conductor-filled through vias 613.

Figure 6B:
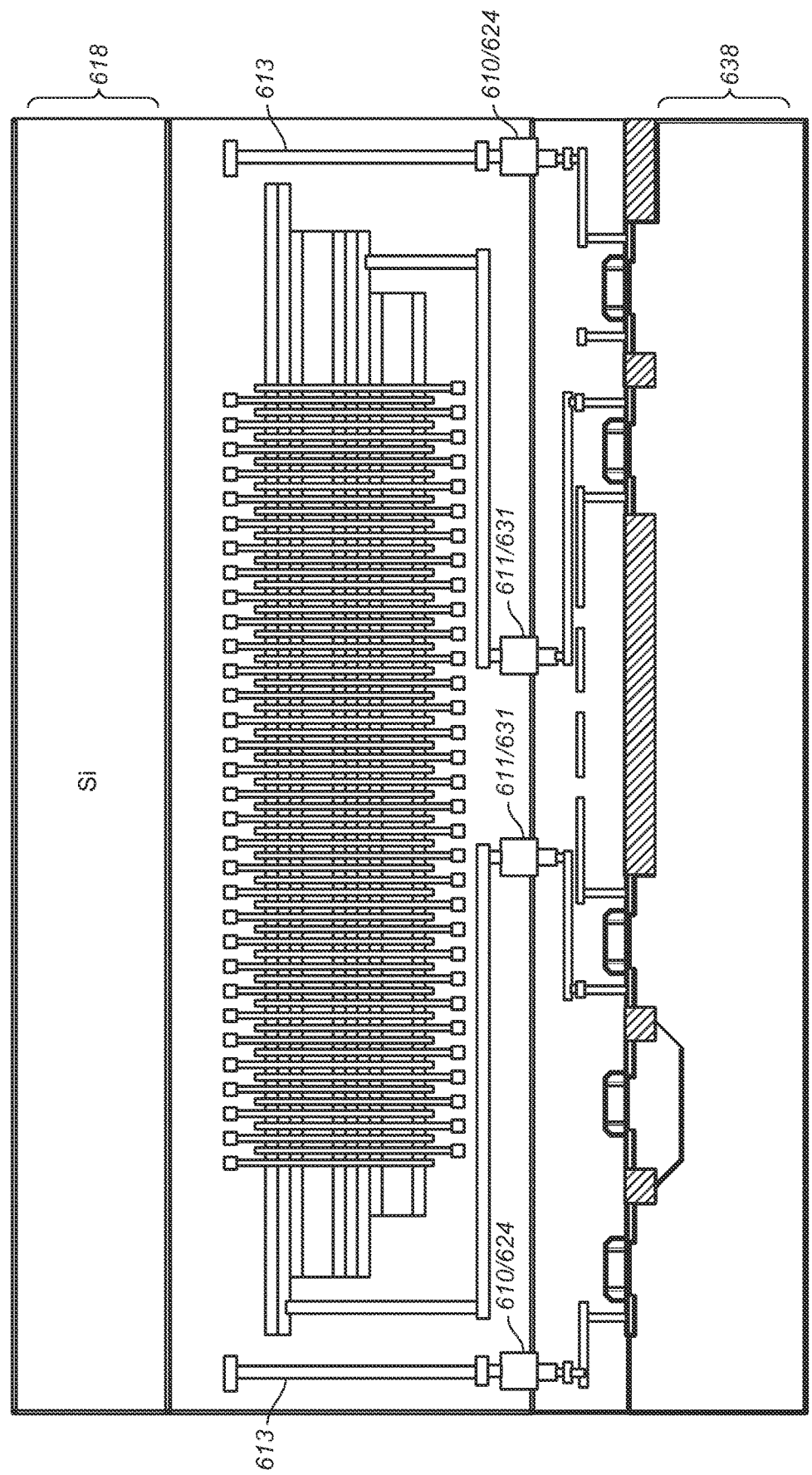
FIGS. 6a. 6b, 6c and 6d illustrate the use of through vias in a QVM circuit that is wafer-bonded with two other circuits in accordance with one embodiment of the present invention.

FIG. 6b shows QVM circuit 601 "flipped over" and wafer-bonded with logic circuit 602. The wafer-bonding may be achieved using, for example, "hybrid bonding" techniques that effectuate bonding of the corresponding silicon oxide materials and the corresponding copper materials across the surfaces of QVM circuit 601 and logic circuit 602. As shown in FIG. 6b, hybrid bonding pads 610 (connected to through vias 613) on QVM circuit 601 are bonded to hybrid bonding pads 624 of logic circuit 602 and hybrid bonding pads 611 of QVM circuit 601 are bonded to hybrid bonding pads 631 of logic circuit 602.

Figure 6C:
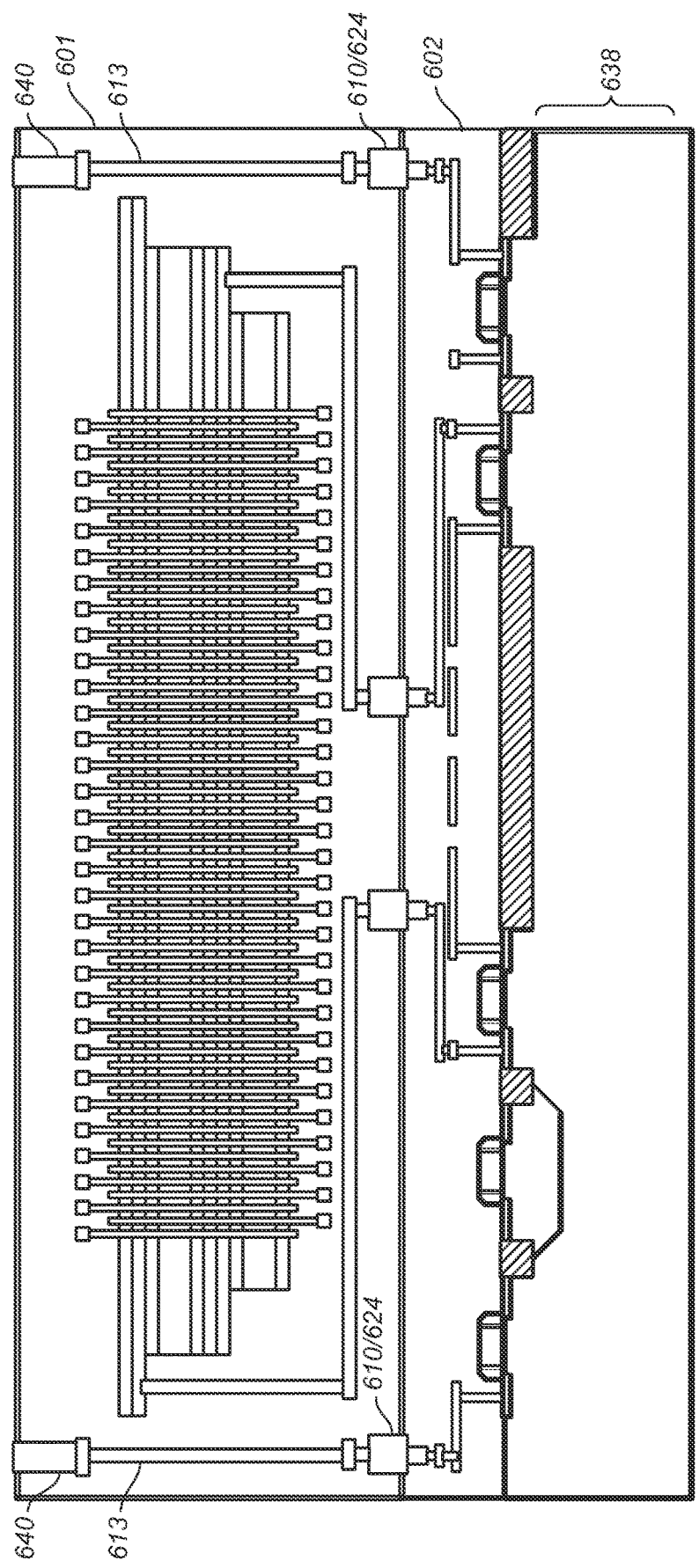
Figure 6D:
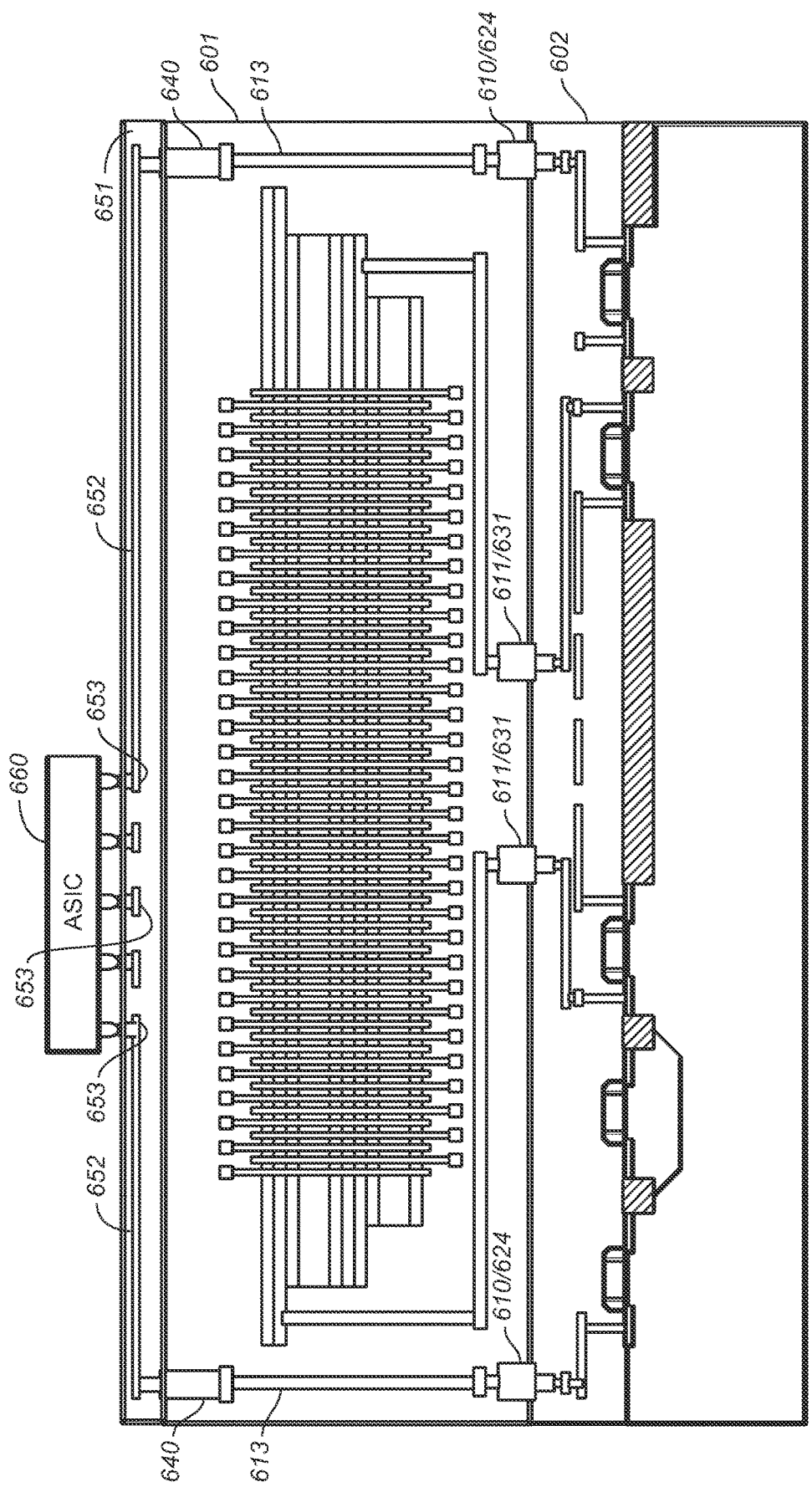

Thereafter, silicon substrate 618 of QVM circuit 601 is substantially removed, for example, by grinding. In FIG. 6c, substantial removal of silicon substrate 618 exposes the silicon oxide in which conductor-filled through vias 613 are embedded. Vias 640 are then etched into the silicon oxide of QVM circuit 601 and conductor-filled. (Suitable conductor material may be, for example, copper). Then, as shown in FIG. 6d, redistribution layer 651 including copper interconnection network 652 may be provided by a damascene process, in advance of attaching a second wafer-bonded circuit to QVM circuit 601. Interconnection network 652 is made available for access electrically by bonding pads 653. In FIG. 6d, the second wafer-bonded circuit is shown as application-specific integrated circuit (ASIC) die 660. ASIC die 660 may be bonded to QVM circuit 601 using die-to-wafer bump bonds, as known to those of ordinary skill in the art.

The above detailed description is provided to illustrate specific embodiments of the present invention and is not intended to be limiting. Numerous variations and modifications within the scope of the present invention are possible. The present invention is set forth in the accompanying claims.

We claim:

1. A memory device, comprising:
a memory circuit formed on a planar surface of a semiconductor substrate, the memory circuit comprising a plurality of modular memory units, each modular memory unit comprising a three-dimensional array of storage transistors, each storage transistor being accessed by a word line and a bit line; and
support circuitry for the memory circuit formed in the semiconductor substrate under the memory circuit, the support circuitry comprising a plurality of modular circuit units, each modular circuit unit being formed underneath an associated one of the modular memory units to support memory operations of that modular memory unit,
wherein each modular memory unit is configurable to be operated independently by the associated modular circuit unit to perform memory operations and two or more modular memory units are configurable to be operated in parallel by their respective associated modular circuit units to perform memory operations.

2. The memory device of claim 1, wherein the memory operations comprising erase, program, read and refresh operations.

3. The memory device of claim 2, wherein the memory device receives one or more control signals each including a command signal and an associated address signal, the address signal included in each control signal designating one of the modular memory units for receiving the associated command signal.

4. The memory device of claim 3, wherein the modular memory units designated by the address signals are operated in parallel by their respective associated modular circuit units to perform the memory operations specified by the associated command signals.

5. The memory device of claim 3, wherein the memory device receives the control signals from a controller integrated circuit formed on a separate semiconductor substrate.

6. The memory device of claim 5, wherein the controller integrated circuit comprises a host interface for communicating with a host device, logic circuits configured to implement management functions of the memory device, one or more write buffers for storing write data to be stored on the memory device, and an error correction circuit for performing error correction on data stored in the memory device.

7. The memory device of claim 2, wherein the memory operations further comprise a write operation that includes the erase operation followed by the program operation.

8. The memory device of claim 7, wherein the memory device further receives a write data signal specifying a write data value associated with the write operation.

9. The memory device of claim 3, wherein each modular circuit unit comprises a word line driver circuit and a bit line driver circuit, address decoders for decoding the address signal to select the designated modular memory unit and the designated storage transistors therein, sense amplifiers to read stored data from the selected storage transistors, voltage sources for generating operating voltages for the driver circuits, latches or registers, and a state machine for managing the read, write, erase, and refresh operations at the associated modular memory unit.

10. The memory device of claim 9, wherein each modular memory unit further comprises a layer of interconnect conductors formed above and in electrical connection with the three-dimensional array of storage transistors and the associated modular circuit unit, the layer of interconnect conductors being provided for routing control and data signals among the storage transistors and the modular circuit unit to perform memory operations.

11. The memory device of claim 1, wherein the memory circuit comprises a quasi-volatile memory circuit.

12. The memory device of claim 11, wherein the storage transistors of the quasi-volatile memory circuit each has a retention time of greater than 1 day and an endurance of a million or more program-erase cycles.

13. The memory device of claim 1, wherein the memory circuit comprises a non-volatile memory circuit.

14. The memory device of claim 1, wherein the storage transistors each comprise a storage material programmable by a direct tunneling technique.

15. The memory device of claim 1, wherein the storage transistors each comprise a ferroelectric storage transistor.

16. The memory device of claim 3, wherein the three-dimensional array of storage transistors comprises a plurality of NOR memory strings.

17. The memory device of claim 16, wherein the three dimensional array of NOR memory strings are arranged in parallel in a first direction and stacked in a second direction each NOR memory string including a plurality of storage transistors sharing a common source layer and a common drain layer, with each layer extending along a third direction, the array of NOR memory strings further comprising:
(i) a plurality of local word line structures formed between adjacent stacks of NOR memory strings, and
(ii) a plurality of word lines formed above the three dimensional array and extending in the first direction, each word line being connected to a respective subset of the local word line structures, wherein each storage transistor is formed at the junction of each NOR memory string and each local word line structure, each storage transistor comprising (i) a channel region formed between the common source layer and the common drain layer, (ii) a gate dielectric layer and (iii) the local word line structure as a gate conductor.

18. The memory device of claim 1, wherein each modular circuit unit has the same dimensions in the first and second directions as its associated modular memory unit.

19. The memory device of claim 17, wherein in response to one of the control signals, the address signal of the control signal designating a modular memory unit to be accessed, the modular circuit unit of the designated modular memory unit activates one of the word lines, selects and activates a page of bit lines, and performs a memory operation indicated by the associated command signal.

20. The memory device of claim 19, wherein each modular circuit unit comprises:
an address decoder and a plurality of word line driver circuits coupled to select and activate a selected one of the word lines;
a plurality of bit line selector transistors coupled to select a page of bit lines;
a plurality of sense amplifiers coupled to the bit line selector transistors to sense data values associated with selected bit lines;
one or more data latches for storing sensed data from the selected storage transistor;
voltage generators for generating power supply voltages, ground voltages, programming, erase or read voltages, or reference voltages; and
a state machine to control operation of the associated memory unit to perform erase, program, read and refresh operations in response to the command signal.

\* \* \* \* \*